(12) United States Patent
Stricker et al.

(10) Patent No.: US 7,136,268 B2
(45) Date of Patent: Nov. 14, 2006

(54) TUNABLE ESD TRIGGER AND POWER CLAMP CIRCUIT

(75) Inventors: Andreas D. Stricker, Essex Junction, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 465 days.

(21) Appl. No.: 10/708,911

(22) Filed: Mar. 31, 2004

(65) Prior Publication Data

US 2005/0225910 A1     Oct. 13, 2005

(51) Int. Cl.
*H02H 9/00* (2006.01)
*H01L 23/62* (2006.01)

(52) U.S. Cl. .............................. 361/56; 257/362
(58) Field of Classification Search ............. 361/56; 257/362
See application file for complete search history.

(56) References Cited

U.S. PATENT DOCUMENTS 6,552,406 B1* 4/2003 Voldman ............... 257/473
6,720,637 B1* 4/2004 Voldman ............... 257/473
6,878,976 B1* 4/2005 Coolbaugh et al. ........ 257/183
7,001,806 B1* 2/2006 Tilke et al. ............... 438/202
7,012,288 B1* 3/2006 Lee et al. ................. 257/197

OTHER PUBLICATIONS

Sue E. Strang et al., A Design System for Auto-Generation of ESD Circuits, Sep. 16-18, 2002, IBM Communications Research and Development Center (CRDC), 10 pages.

* cited by examiner

*Primary Examiner*—Brian Sircus
*Assistant Examiner*—Boris Benenson
(74) *Attorney, Agent, or Firm*—Schmeiser, Olsen & Watts; Anthony Canale

(57) ABSTRACT

A circuit and a method for the electrostatic discharge protection of integrated circuits. The electrostatic discharge protection circuit, including: an electrostatic discharge protection circuit, comprising: a first bipolar transistor coupled between a first circuit node and a second circuit node, the first bipolar transistor having a non-uniform subcollector region geometry, the first bipolar transistor having a different value for collector to emitter breakdown voltage than a value for collector to emitter breakdown voltage of an otherwise identical bipolar transistor having a uniform subcollector region geometry.

40 Claims, 16 Drawing Sheets

TUNABLE ESD TRIGGER AND POWER CLAMP CIRCUIT

BACKGROUND OF INVENTION

1. Field of the Invention

The present invention relates to the field of electrostatic discharge (ESD) and power clamp circuits; more specifically, it relates to ESD and power clamp circuits tunable to unity current gain cutoff frequency (fT) and collector to emitter with base open breakdown voltage (BVceo).

2. Background of the Invention

The manufacture of high performance bipolar transistors requires reduction of the vertical profile as well as reduction of transistor parasitics. In order to reduce the collector transit time of the carriers, the subcollector is placed close to the collector-base junction. As the base and collector regions are moved closer together, the collector-to-emitter breakdown voltage, BVceo, decreases and the frequency response of the transistor, fT, increases. In ESD applications, there is a need to be able to provide both a low capacitance device, or a device with a different breakdown voltage than the standard device which requires protection.

SUMMARY OF INVENTION

A first aspect of the present invention is an electrostatic discharge protection circuit, comprising: a first bipolar transistor coupled between a first circuit node and a second circuit node, the first bipolar transistor having a non-uniform subcollector region geometry, the first bipolar transistor having a different value for collector to emitter breakdown voltage than a value for collector to emitter breakdown voltage of an otherwise identical bipolar transistor having a uniform subcollector region geometry.

A second aspect of the present invention is a method of providing an electrostatic discharge protection to an integrated circuit, comprising: providing a first bipolar transistor; coupling the first bipolar transistor between a first circuit node and a second circuit node, the first bipolar transistor having a non-uniform subcollector region geometry; and selecting the non-uniform subcollector region geometry in order to tune a collector to emitter breakdown voltage of the first bipolar transistor.

A third aspect of the present invention is a method of designing an electrostatic discharge protection circuit, comprising: providing a schematic P-cell circuit generator; providing a hierarchical P-cell layout generator; providing a graphical unit interface to the schematic P-cell circuit generator and the hierarchical P-cell layout generator; accepting a value for a collector to emitter breakdown voltage target for at least a first bipolar transistor of the electrostatic discharge protection circuit; selecting a non-uniform subcollector region geometry for the first bipolar transistor based on the value of the collector to emitter breakdown voltage target; and generating a circuit design and a layout for the electrostatic discharge protection circuit, the electrostatic discharge protection circuit containing the first bipolar transistor.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 6A is a plan view of a fifth hetero-junction bipolar transistor suitable for use in an ESD trigger and power clamp circuit according to the present invention and FIG. 5B is a cross-sectional view through line 6B—6B of FIG. 6A;

DETAILED DESCRIPTION

Figure 1:
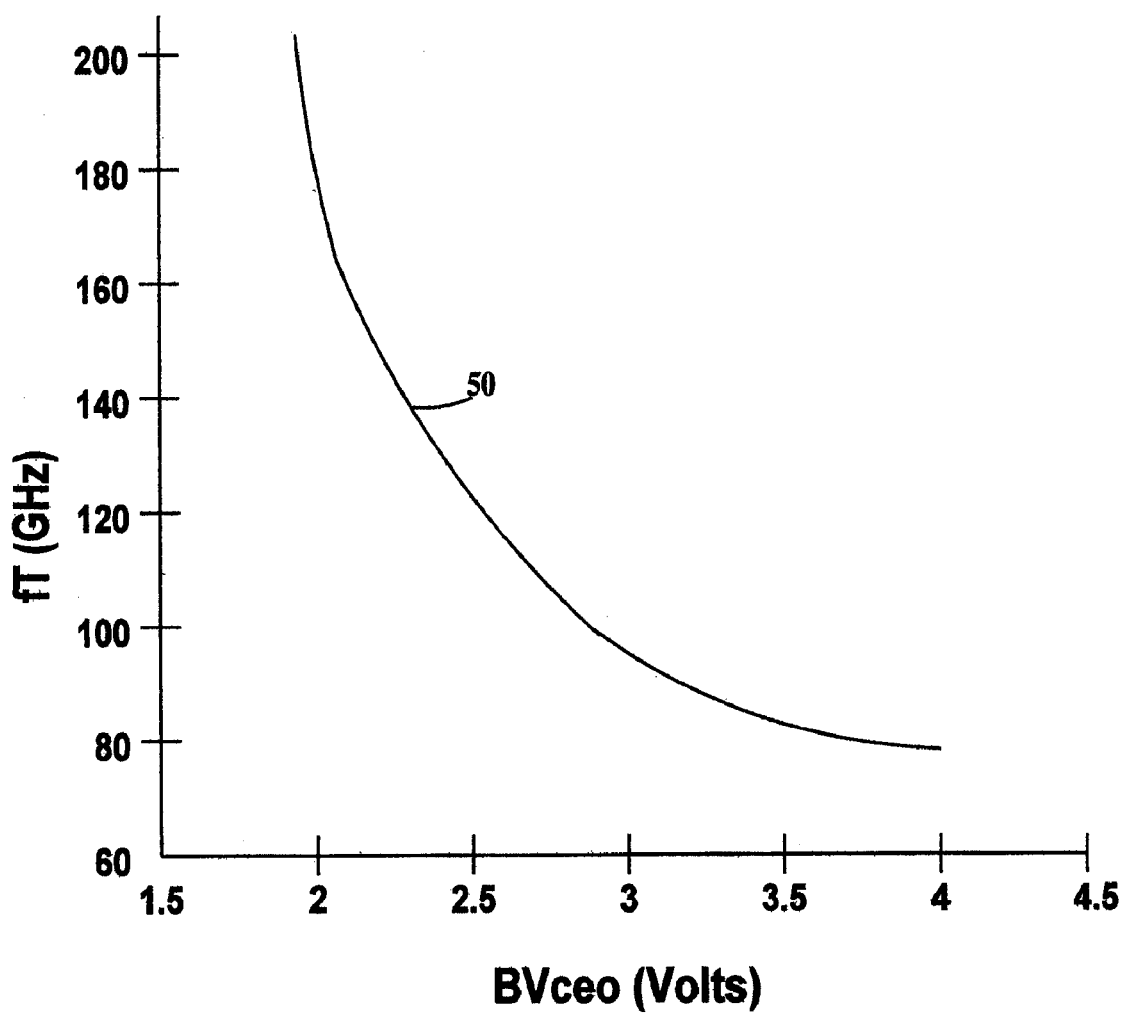
FIG. 1 is a plot illustrating the Johnson limit relationship between BVceo and fT according to the present invention.

FIG. 1 is a plot illustrating the Johnson limit relationship between BVceo and fT according to the present invention. Curve 50 is based on experimental measurement of fT and BVceo for similar size and process NPN SiGe bipolar transistors. The portion of curve 50 below about 3 volts BVceo was obtained from measurements of standard high performance NPN SiGe bipolar transistors. The portion of curve 50 above about 3 volts BVceo was obtained from measurement of from high performance devices modified according to the present invention. The curve of FIG. 1 approximates the Johnson limit equation:

$fT \times BVceo = (Em \times Vs)/2\pi$ (1) where:

fT=unity current gain cutoff frequency;
BVceo=collector-emitter (base open) breakdown voltage;
Em=maximum electric field at current saturation; and
Vs=electron saturation velocity.

Curve 50 indicates that as fT increases BVceo decreases. Curve 50 indicates that for very high fT devices, BVceo may be below the value required for a device used in and ESD circuit. ESD devices typically require a BVceo higher than the operating voltage of the integrated circuit being protected. Curve 50 further indicates that devices modified for use in ESD circuits will have a lower fT than nonmodified or standard devices. However, since ESD events generally occur at frequencies lower than operating the operating frequencies of high performance devices, and operating voltages tend to decrease with increases in operating frequency, the lower fT of modified devices is not a problem, especially for circuits designed for operation of 200 GHz or greater.

Figure 2A:
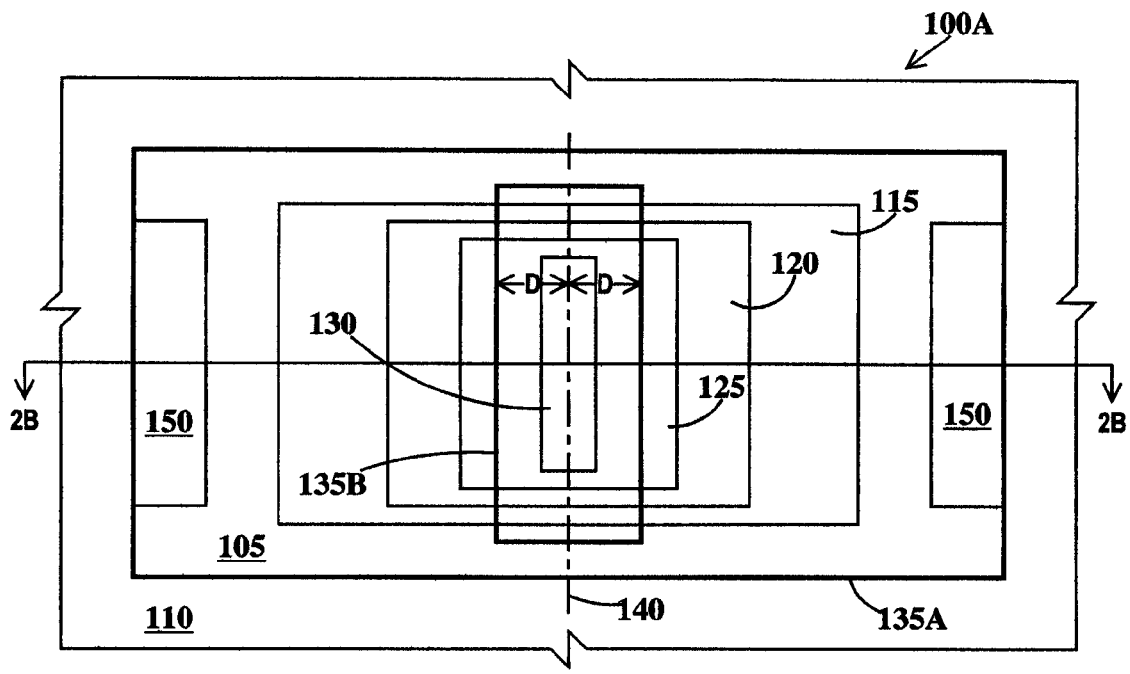
FIG. 2A is a plan view of a first hetero-junction bipolar transistor suitable for use in an ESD trigger and power clamp circuit according to the present invention and FIG. 2B is a cross-sectional view through line 2B—2B of FIG. 2A.
Figure 2B:
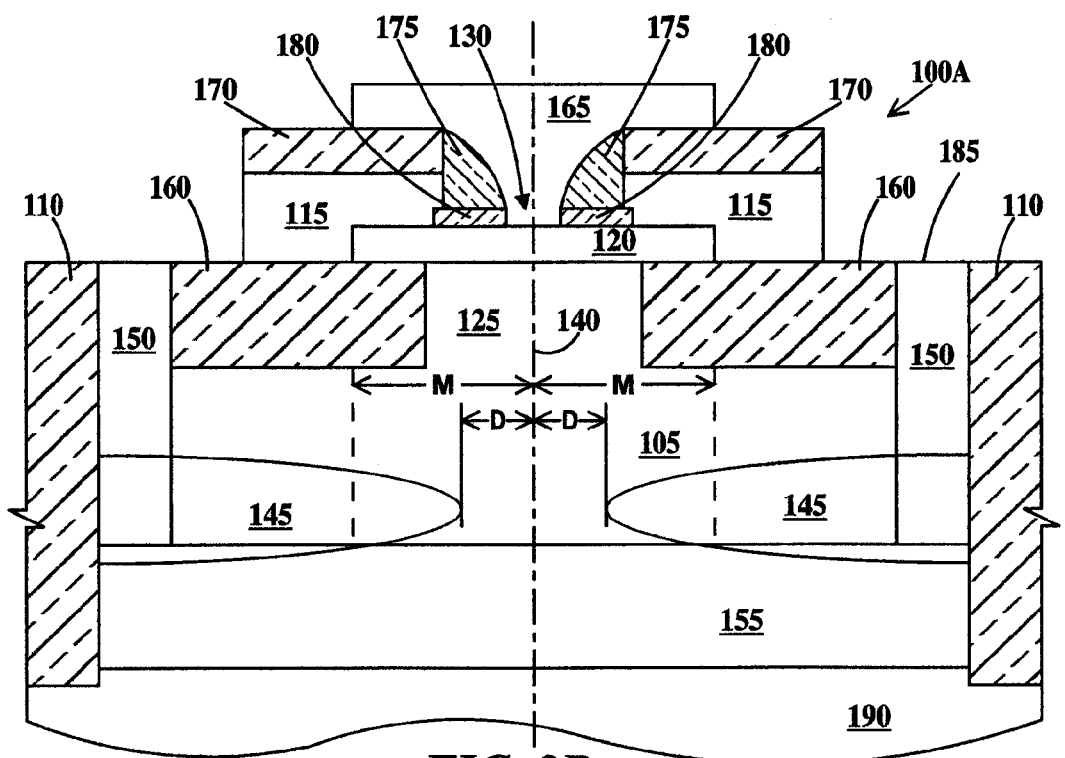

FIG. 2A is a plan view of a first hetero-junction bipolar transistor suitable for use in an ESD trigger and power clamp circuit according to the present invention and FIG. 2B is a cross-sectional view through line 2B—2B of FIG. 2A. In FIG. 2A, a first SiGe bipolar transistor 100A includes an N-well 105 surrounded by deep trench isolation 110. Completely contained within the outline of N-well region 105 is a P type polysilicon base 115. Completely contained within the outline of polysilicon base 115 is a P type low-temperature epitaxial (LTE) base 120. LTE base 120 may comprise SiGe or SiGeC. SiGe (and SiGeC) bipolar transistors are examples of hetero-junction bipolar transistors. Completely contained within the outline of LTE base 120 is an upper portion 125 of N-well 105 in contact with LTE base 120. Completely contained within the out-line of upper portion 125 of N-well 105 is an N type mono-crystalline emitter 130. The space between the heavy line rectangles 135A and 135B defines an N type masked subcollector 145 (see FIG. 2B). Masked subcollector 145 has the shape of a rectangular ring. In FIG. 2A, there is no masked subcollector 145 around emitter 130 a distance D from a plane 140 bisecting emitter 130 longitudinally. First SiGe bipolar transistor 100A also includes N type reach-thru regions 150 contacting an N-type blanket subcollector 155 (see FIG. 2B). Blanket subcollector 155 extends between deep trench isolation 110 under and in contact with N-well 105. Note only one reach-thru region 150 may be used portions of masked subcollector 145 on either side of plane 140 are integrally connected.

Turning to FIG. 2B, several structures not shown in FIG. 2A are illustrated in FIG. 2B. A shallow trench isolation 160 formed in N-well 105 defines the periphery of upper portion 125 of N-well 105. An N-doped polysilicon emitter 165 on top of polysilicon base 115 and LTE base 120 is physically separated and electrically isolated from the polysilicon base by a dielectric layer 170, a dielectric spacer 175 and a dielectric layer 180. Polysilicon emitter 165 is separated and electrically isolated from LTE base 120 by dielectric spacer 175 and dielectric layer 180.

Mono-crystalline emitter 130 is formed from a portion of polysilicon emitter 165 that is in direct physical contact with LTE base 120. Likewise LTE base 120 is formed from that portion of polysilicon base 115 in direct physical contact with N-well 105. Polysilicon base 115, LTE base 120 and polysilicon emitter 165 are formed on a top surface 185 of a bulk silicon substrate 190. Reach-thru regions 150 extend from top surface 185 of substrate 185 through masked subcollector 145 and into blanket subcollector 155. In one example, N-well 105 is an epitaxial silicon layer formed on a P type substrate. Deep trench isolation 110 may include a single dielectric layer or multiple dielectric layers or a dielectric liner with an inner polysilicon core.

In FIG. 2B, it can be seen, that D defines the distance between the maximum lateral extent of masked subcollector 145 from deep trench isolation 110 and plane 140. In other words, masked subcollector 145 extends no further than D from plane 140. The actual mask used in forming masked subcollector 145 has its edges a distance M from plane 140. The difference (M–D) is lateral out-diffusion of the ion implant used to form masked subcollector 145. The term masked subcollector pull back refers to distance M.

The fact that masked subcollector 145 does not extend completely under upper region 125 of N-well 105, that is, masked subcollector 145 has a non-uniform geometry and non-uniform horizontal and vertical doping profiles allows a first tuning of the BVceo (and fT) of first SiGe bipolar transistor 100A. By adjusting the distance M (and thus distance D) the doping level of the N-well between LTE base 120 and blanket subcollector 155 can be controlled so that this region can be depleted to sufficiently to give a higher BVceo (and lower fT) than a standard device. (See FIGS. 12A and 12B which are describe infra). A standard device would be one where M is zero, where masked subcollector 145 is not present or where masked subcollector 145 is not present and blanket subcollector 155 is formed closer to LTE base 120. A second tuning of the BVceo (and fT) of first SiGe bipolar transistor 100A may be obtained by controlling the ion species, dose and energy of the ion-implant process used to form masked subcollector 145.

Figure 3A:
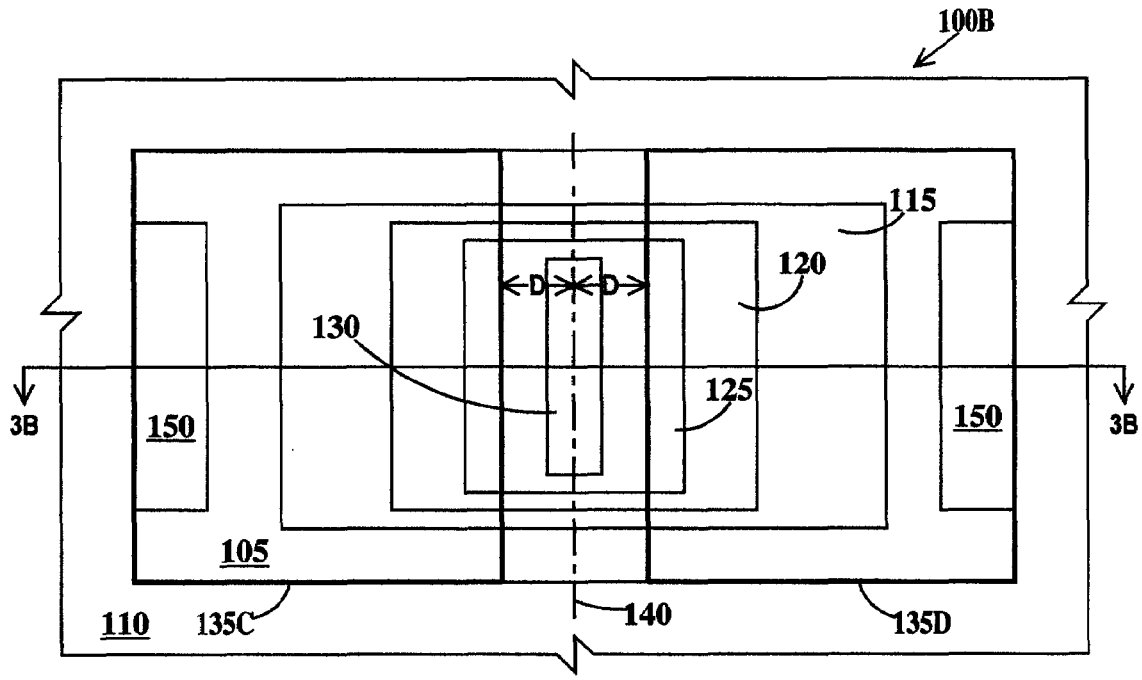
FIG. 3A is a plan view of a second hetero-junction bipolar transistor suitable for use in an ESD trigger and power clamp circuit according to the present invention and FIG. 3B is a cross-sectional view through line 3B—3B of FIG. 3A.
Figure 3B:
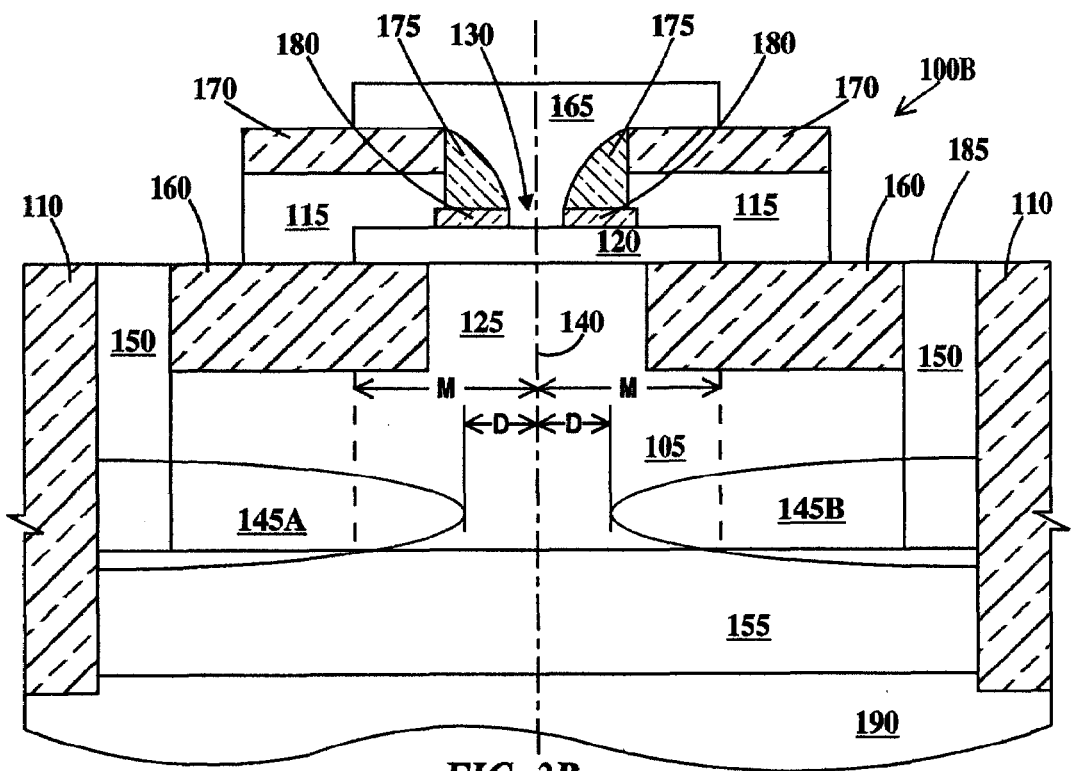

FIG. 3A is a plan view of a second hetero-junction bipolar transistor suitable for use in an ESD trigger and power clamp circuit according to the present invention and FIG. 3B is a cross-sectional view through line 3B—3B of FIG. 3A. In FIGS. 3A and 3B, a second SiGe bipolar transistor 100B is similar to first SiGe bipolar transistor 100A (see FIGS. 2A and 2B) except that masked subcollectors 145A and 145B in FIG. 3B which are seen in FIG. 3A to be dual stripes defined by the heavy line rectangles 135C and 135D are not integral with one another. Thus it is necessary for there to be two separate reach-thru regions 150, one contacting each masked subcollector 145A and 145B.

Figure 4A:
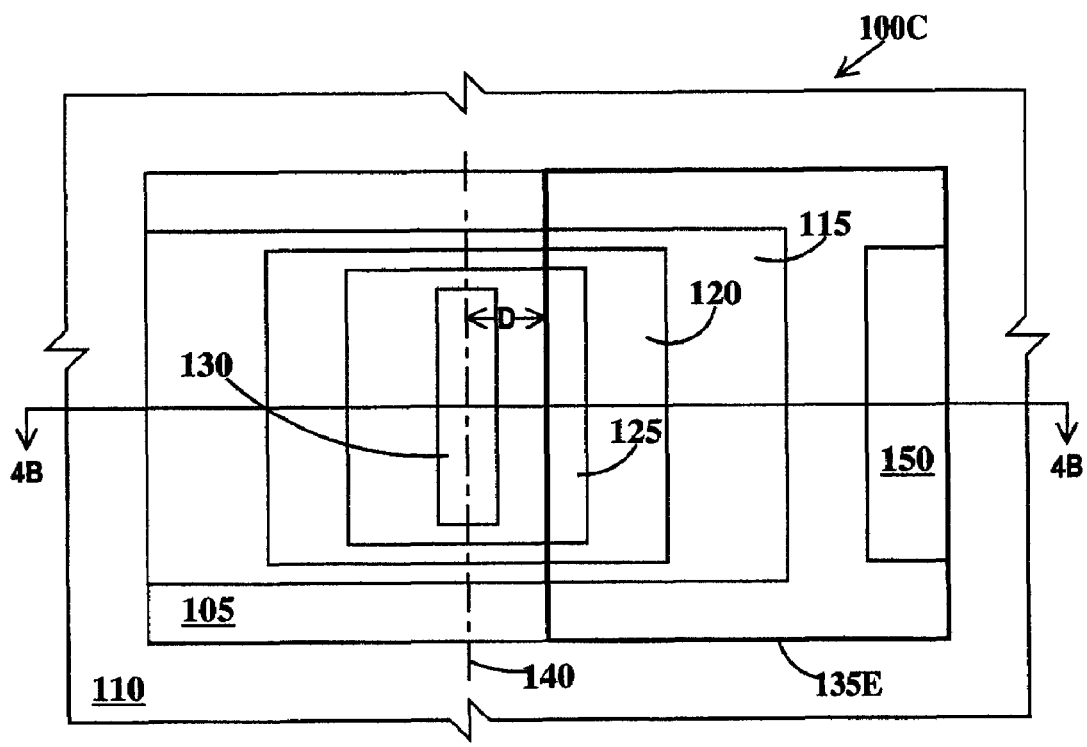
FIG. 4A is a plan view of a third hetero-junction bipolar transistor suitable for use in an ESD trigger and power clamp circuit according to the present invention and FIG. 4B is a cross-sectional view through line 4B—4B of FIG. 4A.
Figure 4B:
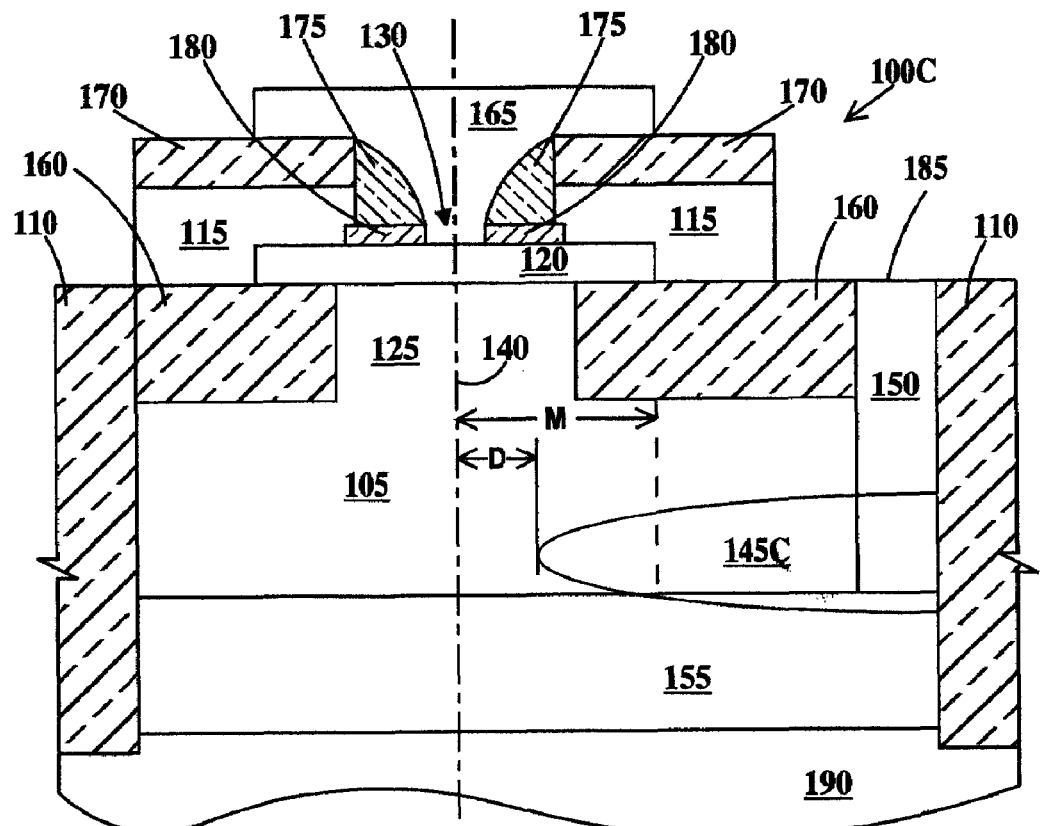

FIG. 4A is a plan view of a third hetero-junction bipolar transistor suitable for use in an ESD trigger and power clamp circuit according to the present invention and FIG. 4B is a cross-sectional view through line 4B—4B of FIG. 4A. In FIGS. 4A and 4B, a third SiGe bipolar transistor 100C is similar to second SiGe bipolar transistor 100B (se FIGS. 3A and 3B) except that there is only one masked subcollector 145C in FIG. 4B which is seen in FIG. 4A to be a single stripe defined by the heavy line rectangle 135E. Thus it is necessary for there to be only one reach-thru region 150 contacting masked subcollector 145C.

Figure 5A:
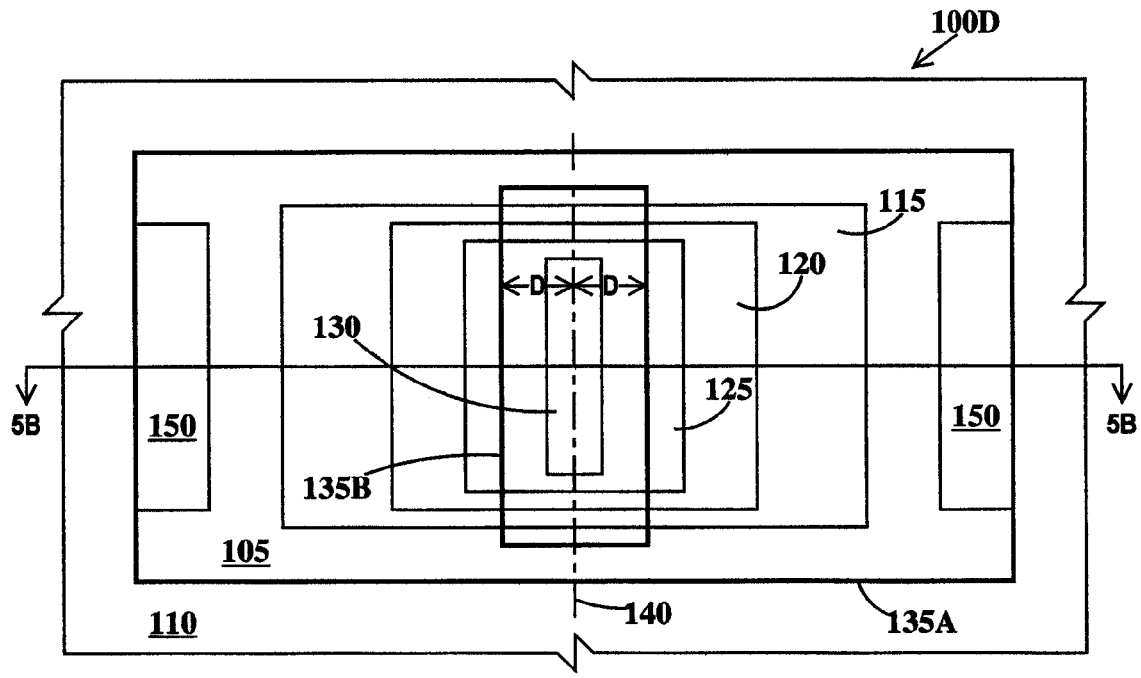
FIG. 5A is a plan view of a fourth hetero-junction bipolar transistor suitable for use in an ESD trigger and power clamp circuit according to the present invention and FIG. 5B is a cross-sectional view through line 5B—5B of FIG. 5A.
Figure 5B:
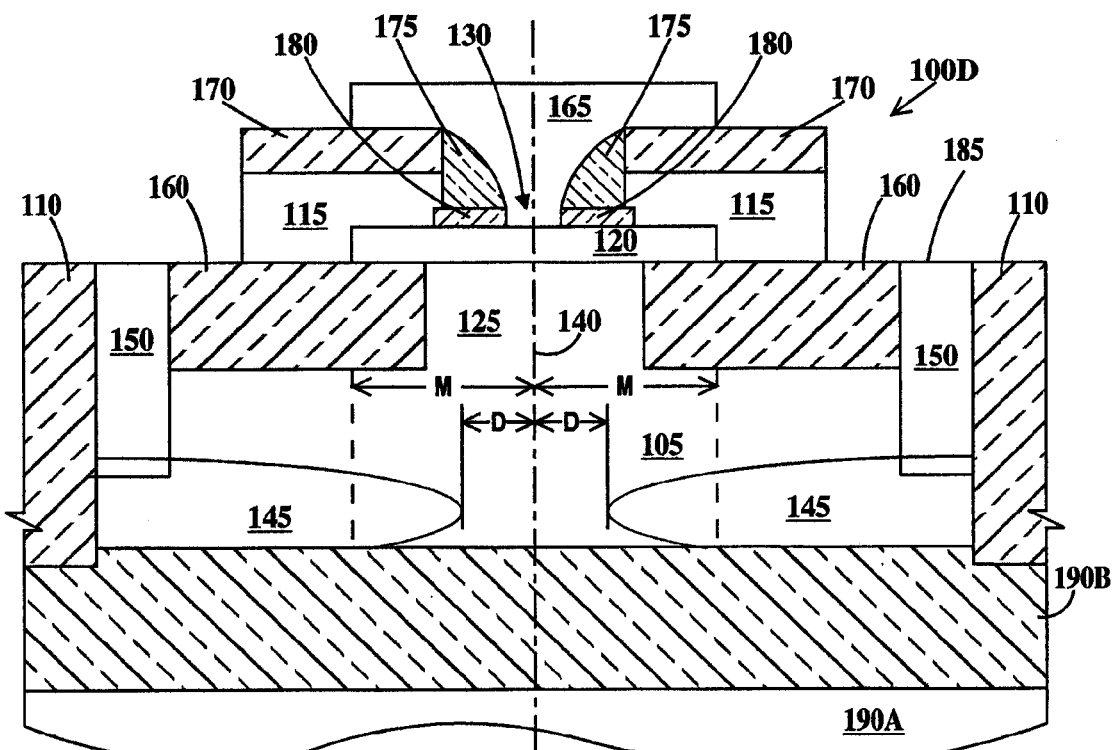

FIG. 5A is a plan view of a fourth hetero-junction bipolar transistor suitable for use in an ESD trigger and power clamp circuit according to the present invention and FIG. 5B is a cross-sectional view through line 5B—5B of FIG. 5A. In FIGS. 5A and 5B, a fourth SiGe bipolar transistor 100D is similar to first SiGe bipolar transistor 100A (se FIGS. 2A and 2B) except that substrate 190A is an silicon-on-insulator (SOI) substrate which includes a buried oxide (BOX) layer 190B. There is no blanket subcollector 155 (see FIG. 2B).

It should be noted that the second and third SiGe bipolar transistors 100B and 100C may also be fabricated on an SOI substrate instead of the bulk substrate illustrated in FIGS. 3B and 4B respectively.

Figure 6A:
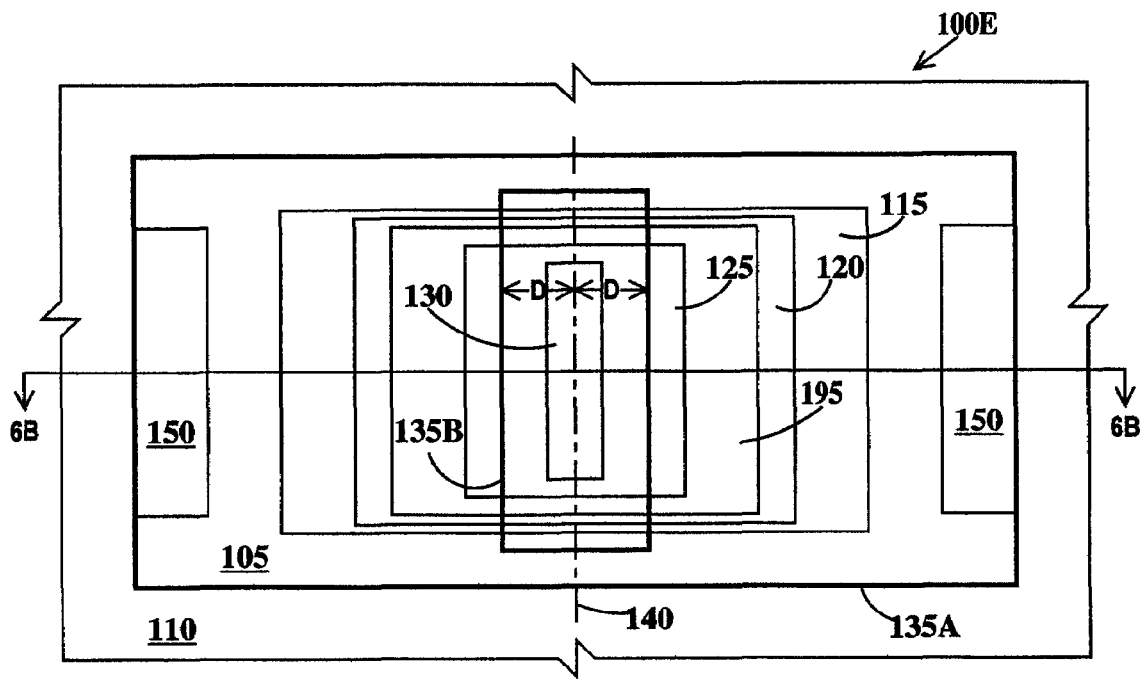
Figure 6B:
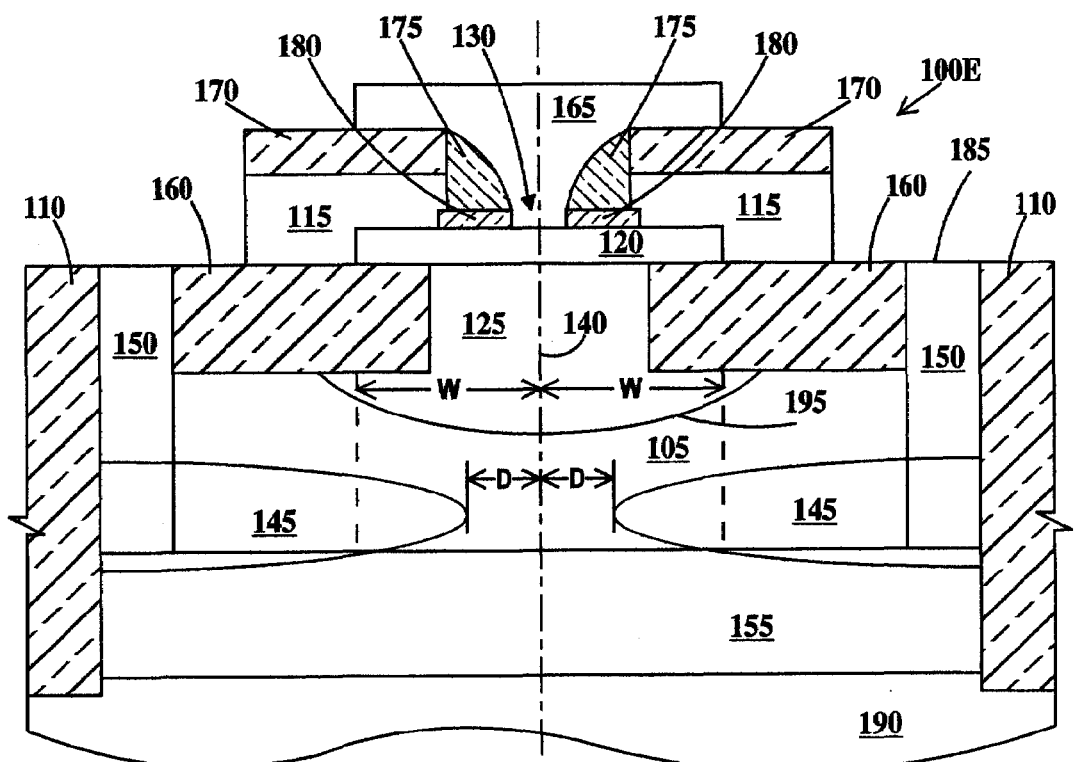

FIG. 6A is a plan view of a fifth hetero-junction SiGe bipolar transistor suitable for use in an ESD trigger and power clamp circuit according to the present invention and FIG. 6B is a cross-sectional view through line 6B—6B of FIG. 6A. In FIGS. 6A and 6B, a fifth SiGe bipolar transistor 100E is similar to first SiGe bipolar transistor 100A (se FIGS. 2A and 2B) except that in FIGS. 6A and 6B a tuning ion implant 195 has been performed to change the doping level between the upper region 125 of N-well 125 and masked subcollector 145. Thus a third tuning of the BVceo (and fT) of fifth SiGe bipolar transistor 100E may be obtained by controlling the ion species, dose and energy of ion-implant 195.

It should be noted that the second, third and fourth SiGe bipolar transistors 100B (see FIGS. 3A and 3B), 100C (see FIGS. 4A and 4B) and 100D (see FIGS. 5A and 5B) may also employ a tuning ion implant as illustrated in FIG. 6B and described supra.

Figure 7A:
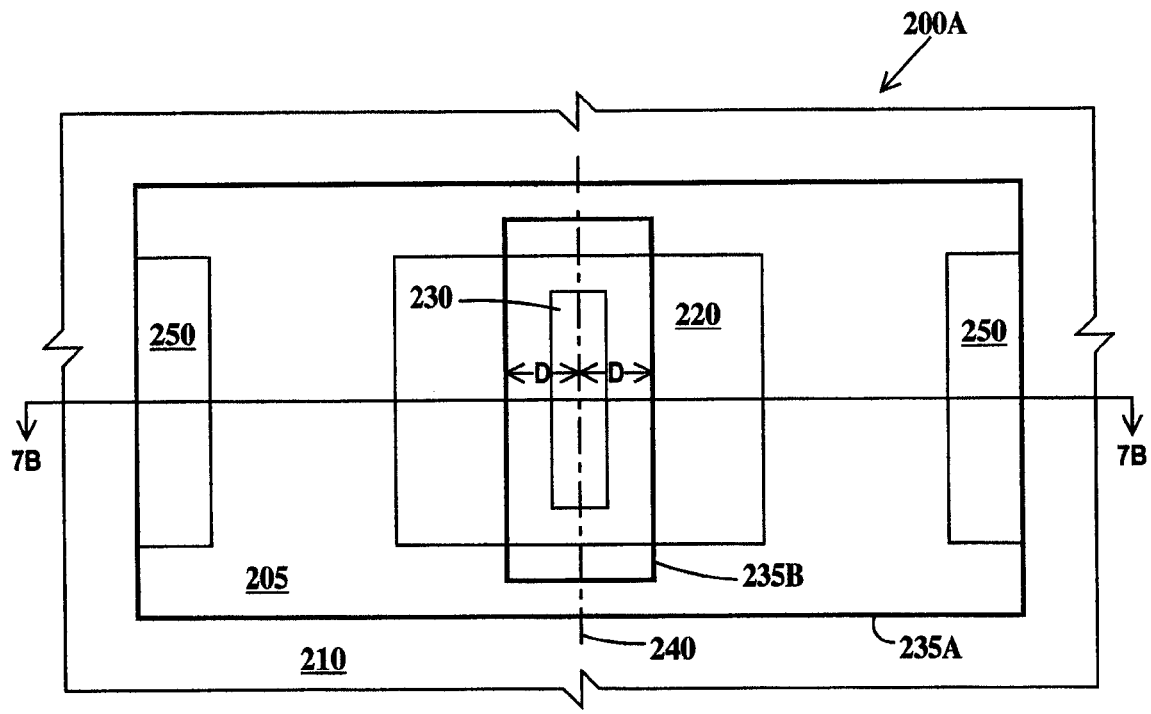
FIG. 7A is a plan view of a first bipolar junction transistor suitable for use in an ESD trigger and power clamp circuit according to the present invention and FIG. 7B is a cross-sectional view through line 7B—7B of FIG. 7A.
Figure 7B:
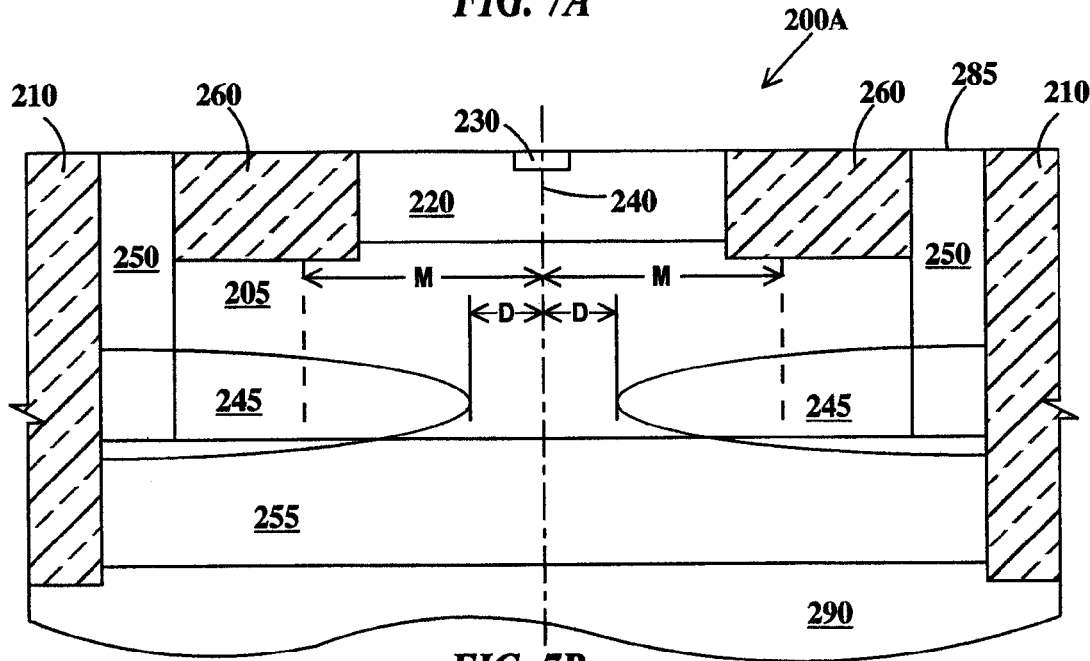

FIG. 7A is a plan view of a first bipolar junction transistor suitable for use in an ESD trigger and power clamp circuit according to the present invention and FIG. 7B is a cross-sectional view through line 7B—7B of FIG. 7A. In FIG. 7A, a first bipolar junction transistor 200A includes an N-well 205 surrounded by deep trench isolation 210. Completely contained within the outline of N-well region 205 is a P type base 220. Completely contained within the outline of base is an N type emitter 230. The space between the heavy line rectangles 235A and 235B defines an N type masked subcollector 245 (see FIG. 7B). Masked subcollector 245 has the shape of a rectangular ring. In FIG. 7A, there is no masked subcollector 245 around emitter 230 a distance D from a plane 240 bisecting emitter 230 longitudinally. First bipolar junction transistor 200A also includes N type reach-thru regions 250 contacting an N-type blanket subcollector 255 (see FIG. 7B). Blanket subcollector 255 extends between deep trench isolation 210 under and in contact with N-well 205. Note only one reach-thru region 250 may be used portions of masked subcollector 245 on either side of plane 240 are integrally connected.

Turning to FIG. 7B, several structures not shown in FIG. 7A are illustrated in FIG. B. A shallow trench isolation 260 formed in N-well 205 defines the periphery of base 220. Emitter 230 is formed within base 220.

Reach-thru regions 250 extend from top surface 285 of a substrate 290 through masked subcollector 245 and into blanket subcollector 255. In one example, N-well 205 is an epitaxial silicon layer formed on a P type substrate. Deep trench isolation 210 may include a single dielectric layer or multiple dielectric layers or a dielectric liner with an inner polysilicon core.

In FIG. 7B, it can be seen, that D defines the distance between the maximum lateral extent of masked subcollector 245 from deep trench isolation 210 and plane 240. In other words, masked subcollector 245 extends no further than D from plane 240. The actual mask used in forming masked subcollector 245 has its edges a distance M from plane 240. The difference (M−D) is lateral out-diffusion of the ion implant used to form masked subcollector 245. The term masked subcollector pull back refers to distance M.

The fact that masked subcollector 245 does not extend completely under base 220, that is, has a non-uniform geometry and non-uniform horizontal and vertical doping profiles allows a first tuning of the BVceo (and fT) of first bipolar junction transistor 200A. By adjusting the distance M (and thus distance D) the doping level of the N-well between base 220 and blanket subcollector 255 can be controlled so that this region can be depleted sufficiently to give a higher BVceo (and lower fT) than a standard device. A standard device would be one where M is zero, where masked subcollector 245 is not present or where masked subcollector 245 is not present and blanket subcollector 255 is formed closer to base 215. A second tuning of the BVceo (and fT) of first bipolar junction transistor 200A may be obtained by controlling the ion species, dose and energy of the ion-implant process used to form masked subcollector 245.

Figure 8A:
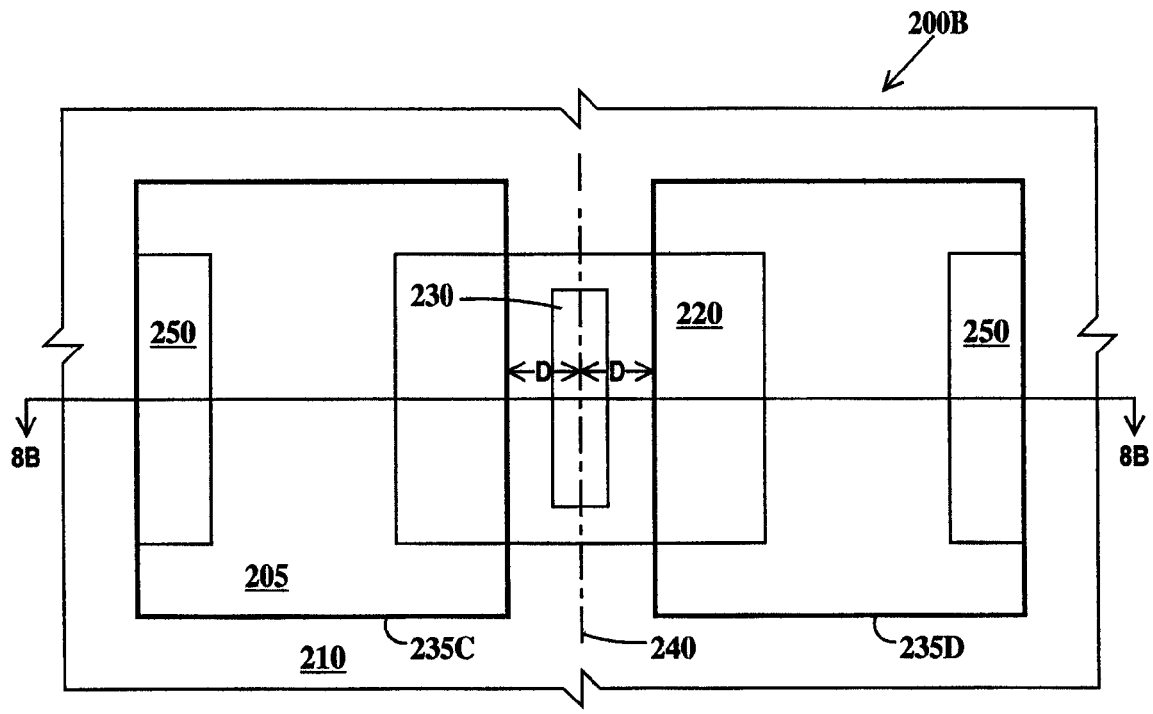
FIG. 8A is a plan view of a second bipolar junction transistor suitable for use in an ESD trigger and power clamp circuit according to the present invention and FIG. 8B is a cross-sectional view through line 8B—8B of FIG. 8A.
Figure 8B:
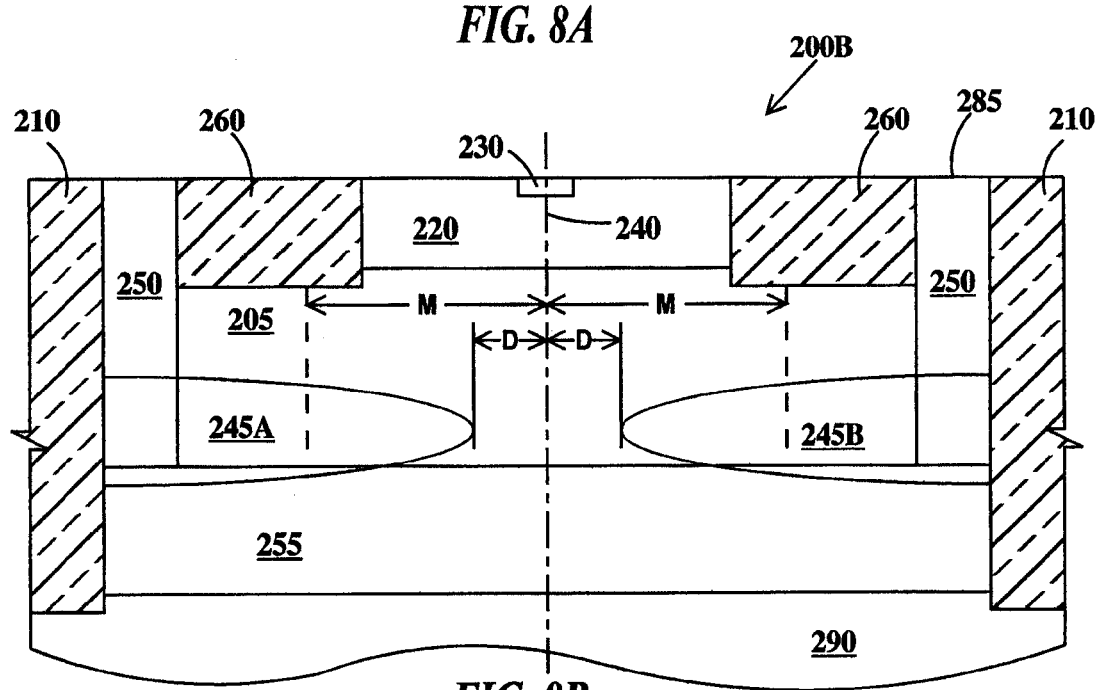

FIG. 8A is a plan view of a second bipolar junction transistor suitable for use in an ESD trigger and power clamp circuit according to the present invention and FIG. 8B is a cross-sectional view through line 8B—8B of FIG. 8A. In FIGS. 8A and 8B, a second bipolar junction transistor 200B is similar to first bipolar junction transistor 200A (see FIGS. 7A and 7B) except that masked subcollectors 245A and 245B in FIG. 7B which are seen in FIG. 7A to be dual stripes defined by the heavy line rectangles 235C and 235D are not integral with one another. Thus it is necessary for there to be two separate reach-thru regions 250, one contacting each masked subcollector 245A and 245B.

Figure 9A:
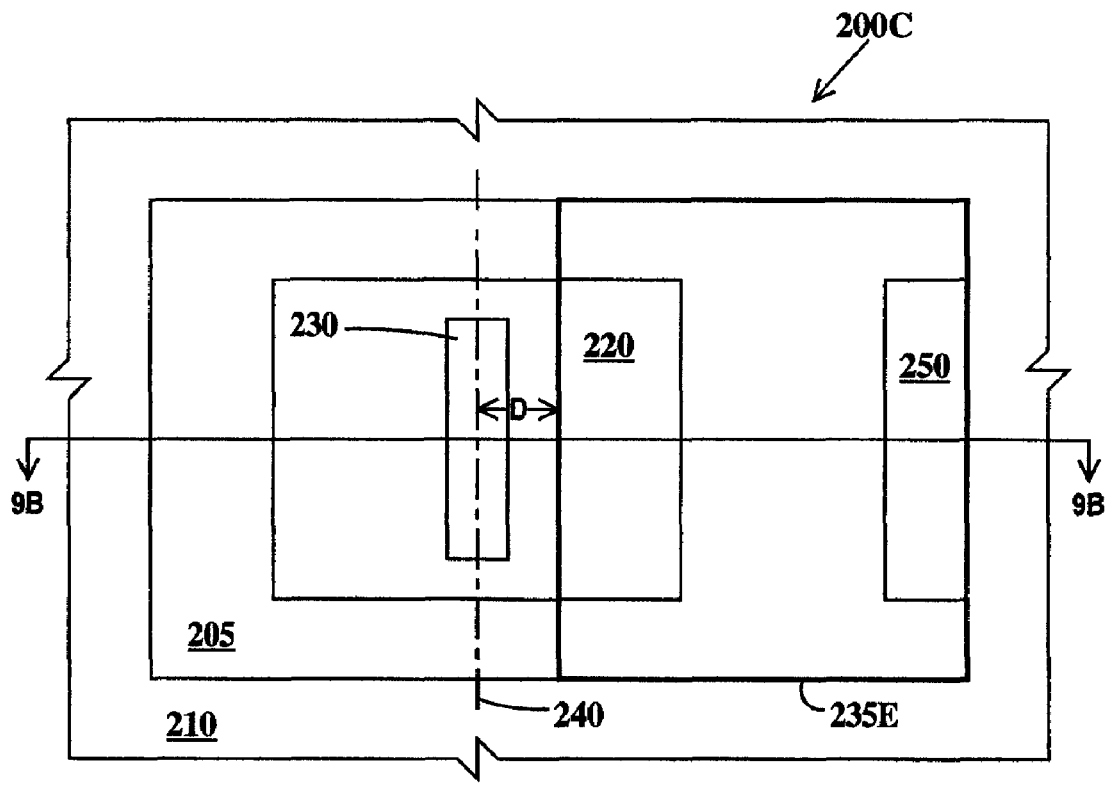
FIG. 9A is a plan view of a third bipolar junction transistor suitable for use in an ESD trigger and power clamp circuit according to the present invention and FIG. 9B is a cross-sectional view through line 9B—9B of FIG. 9A.
Figure 9B:
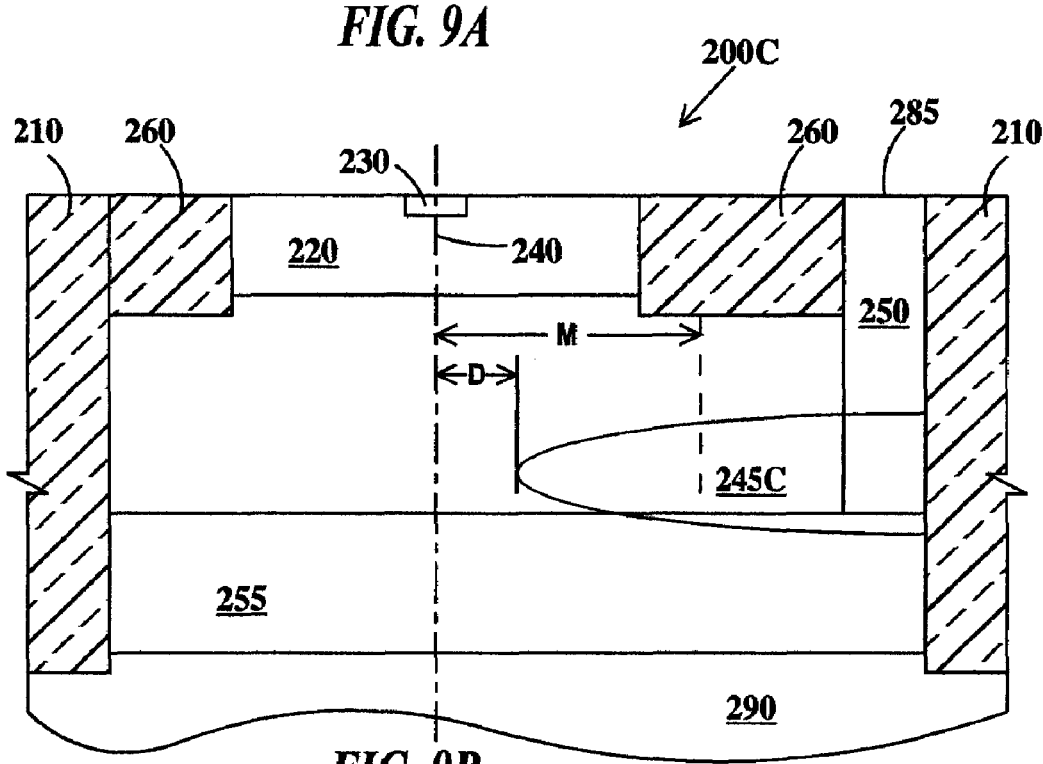

FIG. 9A is a plan view of a third bipolar junction transistor suitable for use in an ESD trigger and power clamp circuit according to the present invention and FIG. 9B is a cross-sectional view through line 9B—9B of FIG. 9A. In FIGS. 9A and 9B, a third bipolar junction transistor 200C is similar to second bipolar junction transistor 200B (se FIGS. 8A and 8B) except that there is only one masked subcollector 245C in FIG. 9B which is seen in FIG. 0A to be a stripe defined by the heavy line rectangle 235E. Thus it is necessary for there to be only one reach-thru region 250 contacting masked subcollector 245C.

Figure 10A:
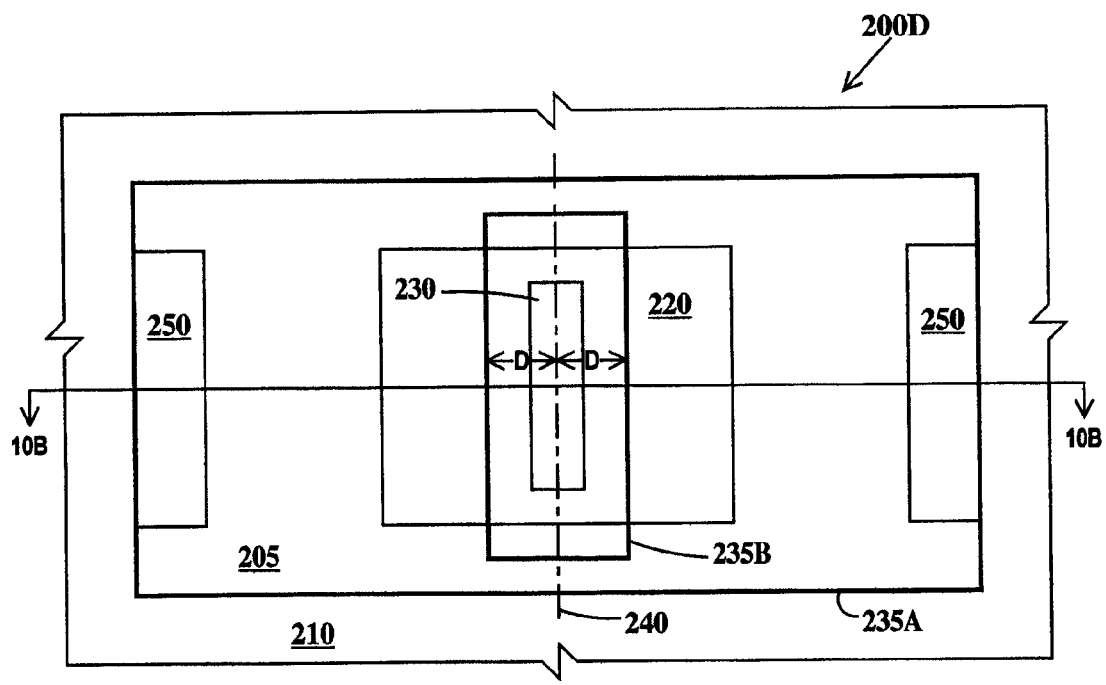
FIG. 10A is a plan view of a fourth bipolar junction transistor suitable for use in an ESD trigger and power clamp circuit according to the present invention and FIG. 10B is a cross-sectional view through line 10B—10B of FIG. 10A.
Figure 10B:
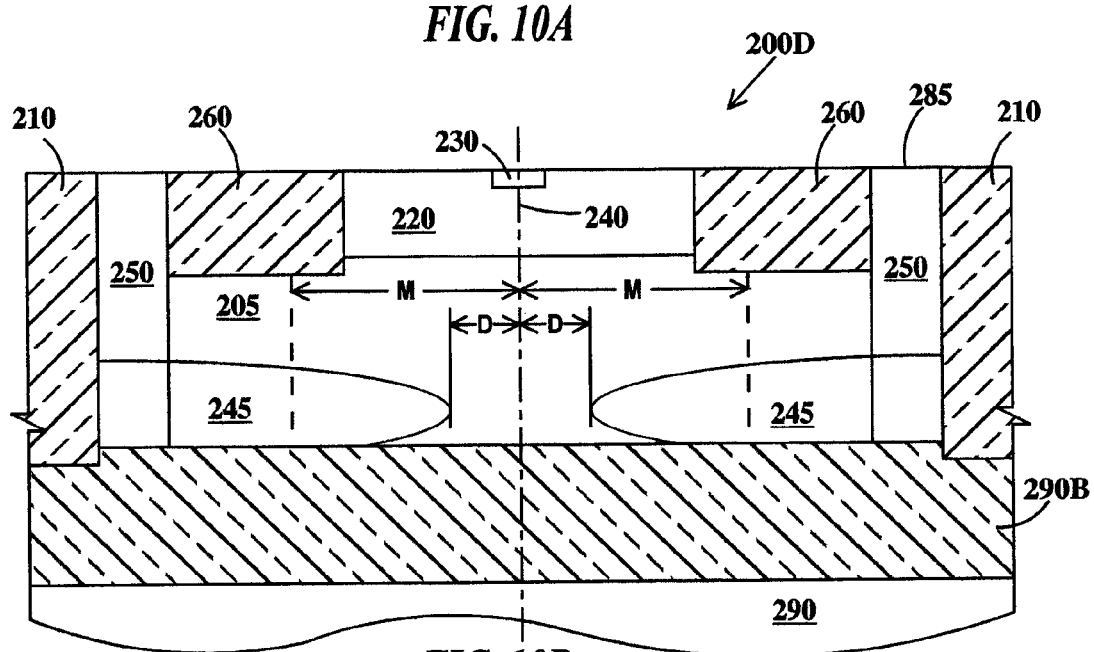

FIG. 10A is a plan view of a fourth bipolar junction transistor suitable for use in an ESD trigger and power clamp circuit according to the present invention and FIG. 10B is a cross-sectional view through line 10B—10B of FIG. 10A. In FIGS. 10A and 10B, a fourth bipolar junction transistor 200D is similar to first bipolar junction transistor 200A (se FIGS. 7A and 7B) except that substrate 290A is an SOI substrate which includes a BOX layer 290B. There is no blanket subcollector 255 (see FIG. 7B).

It should be noted that the second and third bipolar junction transistors 200B and 200C may also be fabricated on an SOI substrate instead of the bulk substrate illustrated in FIGS. 8B and 9B respectively.

Figure 11A:
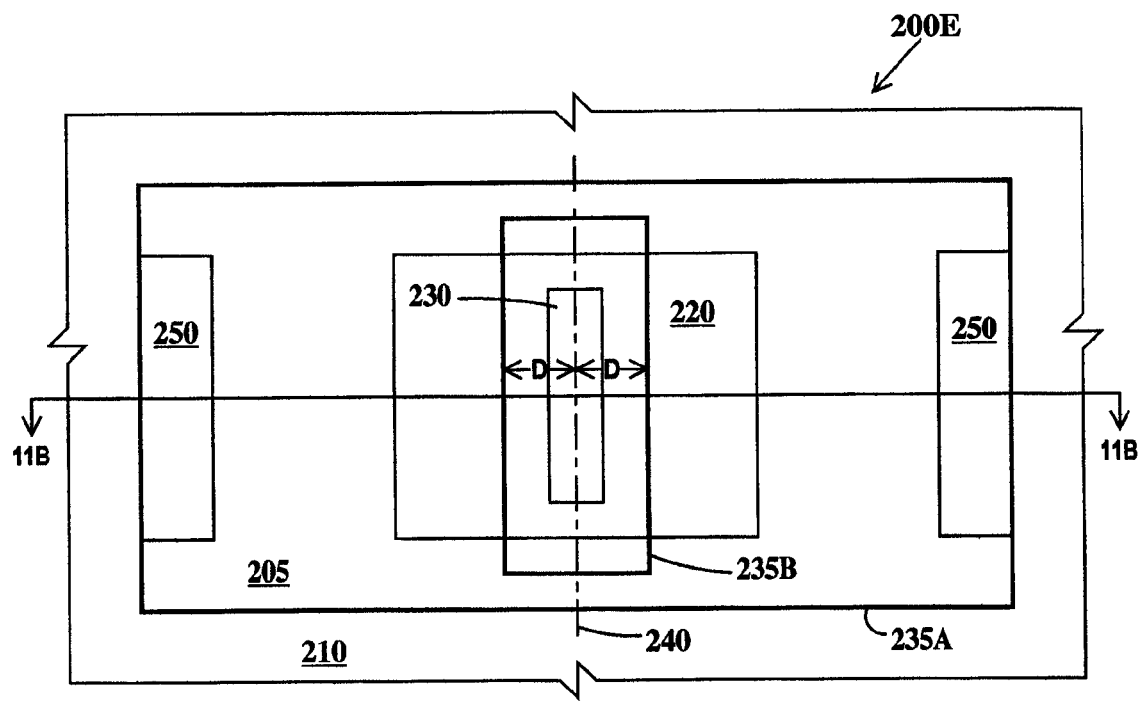
FIG. 11A is a plan view of a fifth bipolar junction transistor suitable for use in an ESD trigger and power clamp circuit according to the present invention and FIG. 11B is a cross-sectional view through line 11B—11B of FIG. 11A.
Figure 11B:
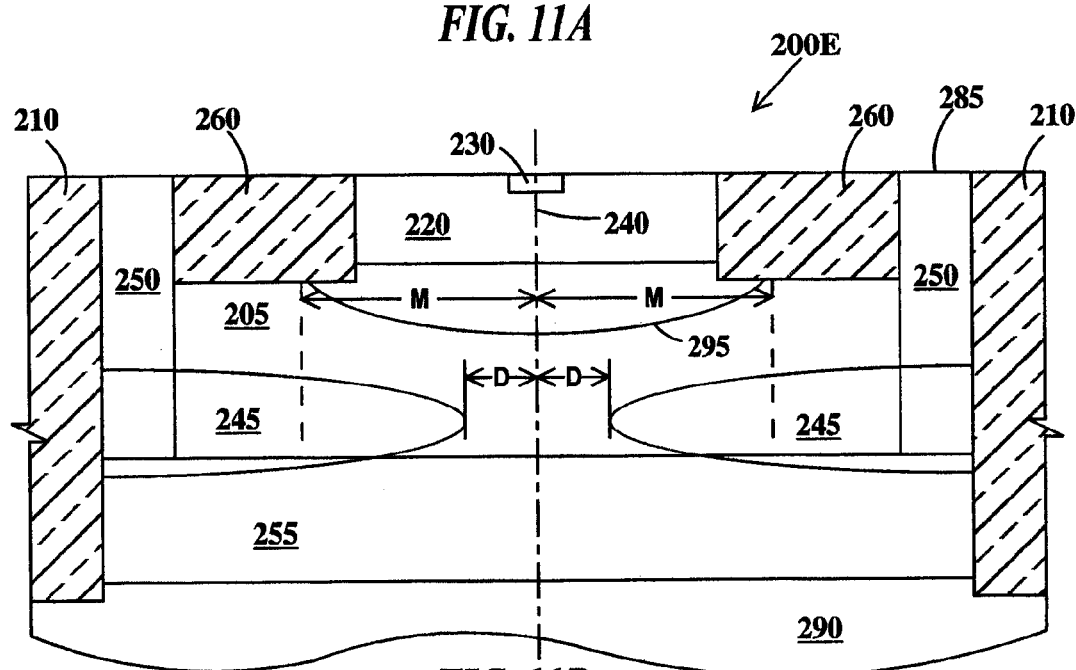

FIG. 11A is a plan view of a fifth bipolar junction transistor suitable for use in an ESD trigger and power clamp circuit according to the present invention and FIG. 11B is a cross-sectional view through line 11B—11B of FIG. 11A. In FIGS. 11A and 11B, a fifth bipolar junction transistor 200E is similar to first bipolar junction transistor 200A (se FIGS. 7A and 7B) except that in FIGS. 11A and 11B a tuning ion implant 295 has been performed to change the doping level of n-well 205 between base 220 and masked subcollector 245. Thus a third tuning of the BVceo (and fT) of fifth bipolar junction resistor 200E may be obtained by controlling the ion species, dose and energy of ion-implant 295.

It should be noted that the second, third and fourth bipolar junction transistors 200B (see FIGS. 8A and 8B), 200C (see FIGS. 9A and 9B) and 200D (see FIGS. 10A and 10B) may also employ a tuning ion implant as illustrated in FIG. 11B and described supra.

Figure 12A:
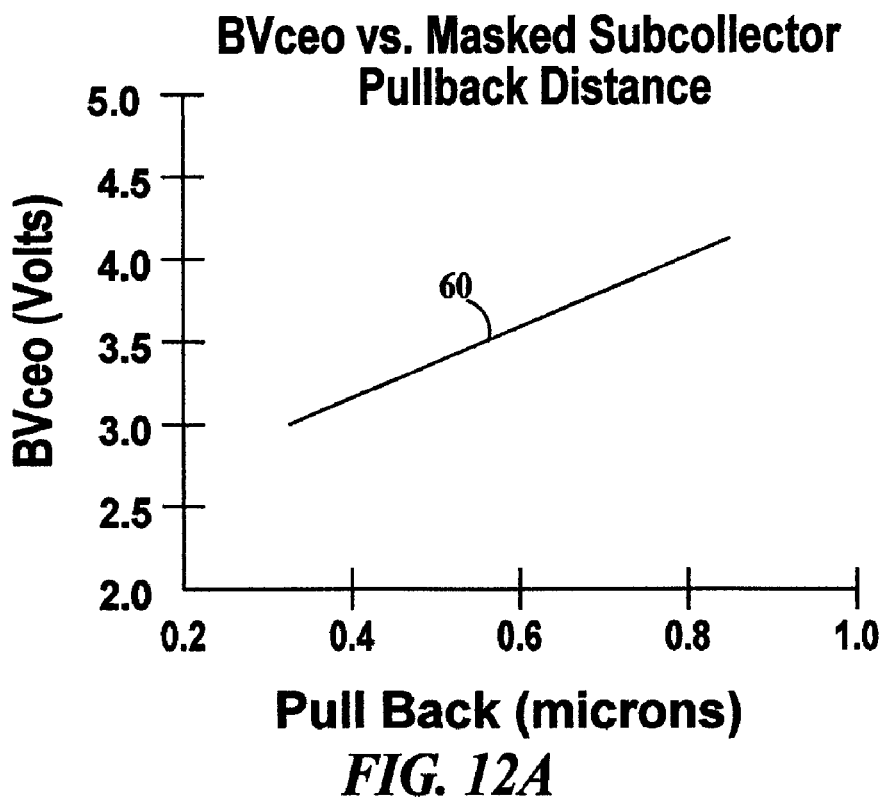
FIG. 12A is a plot illustrating the relationship between BVceo and Masked Subcollector Pullback Distance and FIG. 12B is a plot illustrating the relationship between fT and masked subcollector pull back according to the present invention.

FIG. 12A is a plot illustrating the relationship between BVceo and masked subcollector pull back according to the present invention. Curve 60 is based on experimental measurement of BVceo on NPN SiGe bipolar transistors identical processes and structures except for the amount of masked subcollector pullback on transistors having a total length of about 2.5 microns as measured, for example, between deep trench isolation 155 in FIG. 2B. Curve 60 illustrates that BVceo can be increased and tuned and significantly.

Figure 12B:
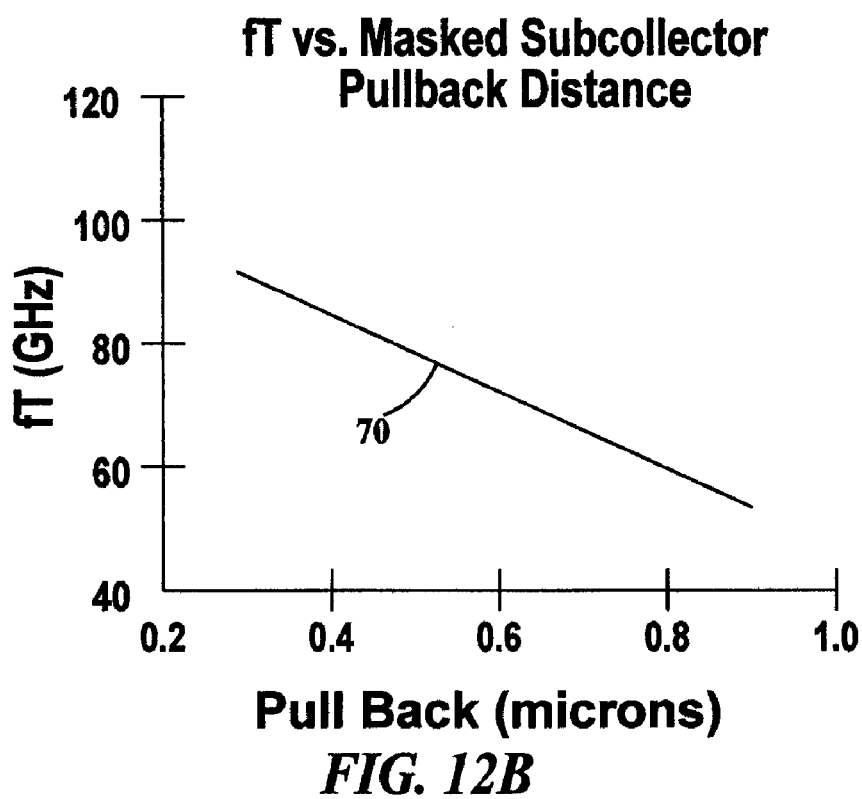

FIG. 12B is a plot illustrating the relationship between fT and masked subcollector pull back according to the present invention. Curve 70 is based on experimental measurement of fT on the same NPN SiGe bipolar transistors measured to generate curve 60 of FIG. 12A.

The SiGe bipolar transistors illustrated in FIGS. 2A and 2B, 3A and 3B, 4A and 4B, 5A and 5B, and 6A and 6B and the bipolar junction transistors illustrated in FIGS. 7A and 7B, 8A and 8B, 9A and 9B, 10A and 10B, and 11A and 11B and described supra, are utilized by the various embodiments of the present invention as trigger or clamp transistors in Darlington type ESD networks as illustrated in FIGS. 13 through 17 and described infra.

Figure 13:
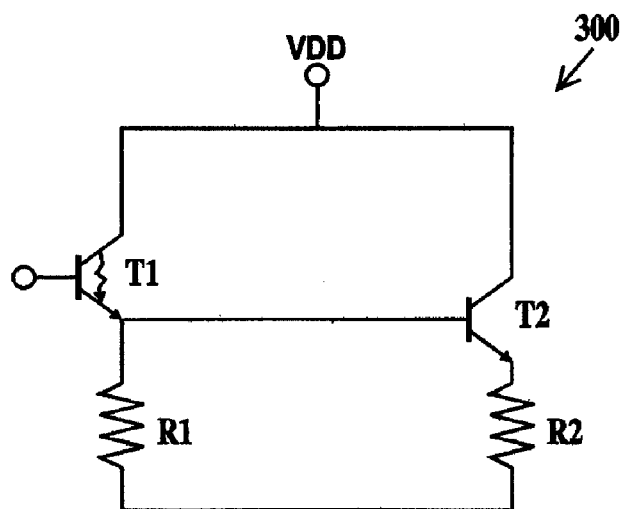
FIG. 13 is an ESD trigger and power clamp circuit according to a first embodiment of the present invention.

FIG. 13 is an ESD trigger and power clamp circuit according to a first embodiment of the present invention. In FIG. 13, circuit 300 includes transistors T1 and T2 and resistors R1 and R2. The collectors of transistor T1 and T2 are coupled to a VDD power rail and the emitters of transistors T1 and T2 are coupled to a VSS power rail through resistors R1 and R2 respectively. The emitter of transistor T1 is coupled to the base of transistor T2 and the base of transistor T1 is open. Transistor T1 may be selected from any of the SiGe bipolar transistors illustrated in FIGS. 2A and 2B, 3A and 3B, 4A and 4B, 5A and 5B, and 6A and 6B and the bipolar junction transistors illustrated in FIGS. 7A and 7B, 8A and 8B, 9A and 9B, 10A and 10B, and 11A and 11B and described supra. The crooked arrow pointing from the collector to the emitter of transistor T1 indicates transistor T1 has a masked subcollector and that the BVceo of transistor T1 has been tuned by at least by fixing the masked subcollector pull back distance as described supra. Transistor T1 may also be further tuned by control of the depth and doping level of the masked subcollector and/or by additional ion implantations between the base and masked subcollector. It should be apparent that the BVceo tuning is fixed during fabrication of transistor T1. The fact that transistor T1 is a BVceo tunable bipolar transistor and has a higher BVceo than would otherwise be obtained, imparts to circuit 300 a higher trigger voltage than would otherwise be obtained using standard bipolar transistors. In a first example the BVceo of transistor T1 is greater than the BVceo of transistor T2. In a second example the BVceo of transistor T1 is less than the BVceo of transistor T2.

Figure 14:
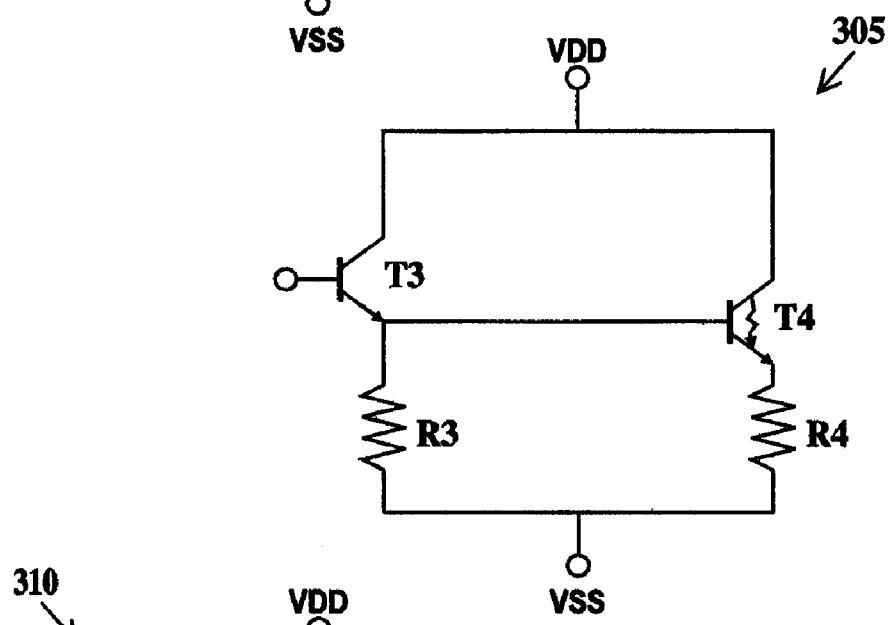
FIG. 14 is an ESD trigger and power clamp circuit according to a second embodiment of the present invention.

FIG. 14 is an ESD trigger and power clamp circuit according to a second embodiment of the present invention. In FIG. 13, circuit 305 includes transistors T3 and T4 and resistors R3 and R4. The collectors of transistor T3 and T4 are coupled to a VDD power rail and the emitters of transistors T3 and T4 are coupled to a VSS power rail through resistors R3 and R4 respectively. The emitter of transistor T3 is coupled to the base of transistor T4 and the base of transistor T3 is open. Transistor T4 may be selected from any of the SiGe bipolar transistors illustrated in FIGS. 2A and 2B, 3A and 3B, 4A and 4B, 5A and 5B, and 6A and 6B and the bipolar junction transistors illustrated in FIGS. 7A and 7B, 8A and 8B, 9A and 9B, 10A and 10B, and 11A and 11B and described supra. The crooked arrow pointing from the collector to the emitter of transistor T4 indicates transistor T4 has a masked subcollector and that the BVceo of transistor T4 has been tuned by at least by fixing the masked subcollector pull back as described supra. Transistor T4 may also be further tuned by control of the depth and doping level of the masked subcollector and/or by additional ion implantations between the base and masked subcollector. It should be apparent that the BVceo tuning is fixed during fabrication of transistor T4. The fact that transistor T4 is a BVceo tunable bipolar transistor and has a higher BVceo than would otherwise be obtained, imparts to circuit 305 a higher clamping voltage than would otherwise be obtained using standard bipolar transistors. In a first example the BVceo of transistor T3 is greater than the BVceo of transistor T4. In a second example the BVceo of transistor T3 is less than the BVceo of transistor T4.

Figure 15:
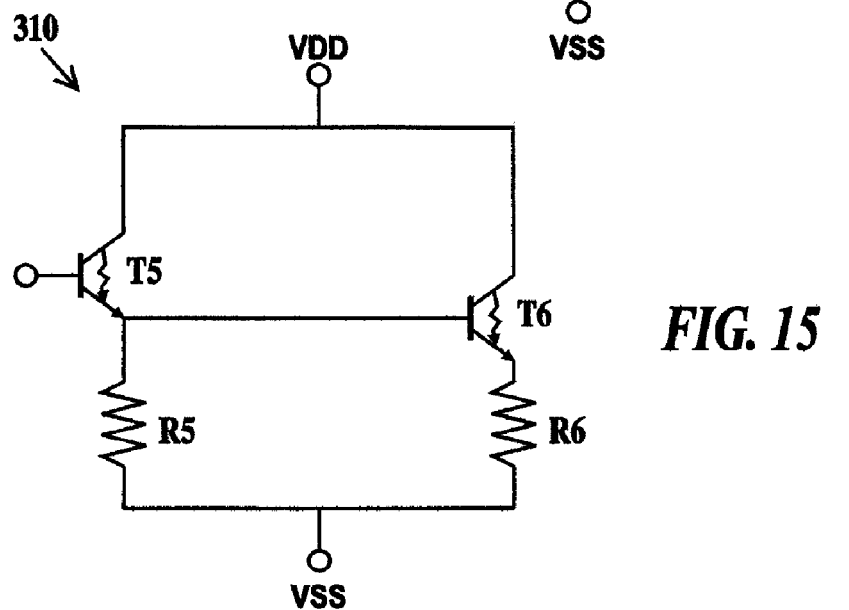
FIG. 15 is an ESD trigger and power clamp circuit according to a third embodiment of the present invention.

FIG. 15 is an ESD trigger and power clamp circuit according to a third embodiment of the present invention. In FIG. 15, circuit 310 includes transistors T5 and T6 and resistors R5 and R6. The collectors of transistor T5 and T6 are coupled to a VDD power rail and the emitters of transistors T5 and T6 are coupled to a VSS power rail through resistors R5 and R6 respectively. The emitter of transistor T5 is coupled to the base of transistor T6 and the base of transistor T5 is open. Transistors T5 and T6 may be independently selected from any of the SiGe bipolar transistors illustrated in FIGS. 2A and 2B, 3A and 3B, 4A and 4B, 5A and 5B, and 6A and 6B and the bipolar junction transistors illustrated in FIGS. 7A and 7B, 8A and 8B, 9A and 9B, 10A and 10B, and 11A and 11B and described supra. The crooked arrow pointing from the collectors to the emitters of transistors T5 and T6 indicates transistors T5 and T6 have masked subcollector and that the BVceo"s of transistors T5 and T6 have been tuned by at least by fixing the masked subcollector pull back as described supra. Transistors T5 and T6 may also be further tuned by control of the depth and doping level of their respective masked subcollectors and/or by additional ion implantations between their respective bases and masked subcollectors. It should be apparent that the BVceo tuning is fixed during fabrication of transistors T5 and T6 and need not be the same for both. The fact that transistors T5 and T6 are BVceo tunable bipolar transistors and have higher BVCeo"s than would otherwise be obtained imparts to circuit 310 a higher trigger voltage and a higher clamping voltage than would otherwise be obtained using standard bipolar transistors. In one example the BVceo of transistor T5 is less than the BVceo of transistor T6.

Figure 16:
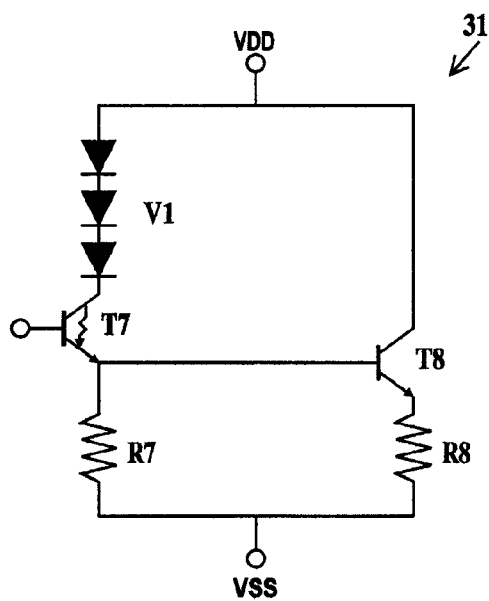
FIG. 16 is an ESD trigger and power clamp circuit according to a fourth embodiment of the present invention.

FIG. 16 is an ESD trigger and power clamp circuit according to a fourth embodiment of the present invention. In FIG. 16, circuit 315 includes transistors T7 and T8, resistors R7 and R8 and a varactor V1 comprised of one or more diode elements which may include but is not limited to SiGe base Schotky diodes, complimentary metal-oxide silicon (CMOS) diodes, a SiGe bipolar transistor configured as a diode or a bipolar junction diode configured as a diode. The collectors of transistor T7 and T8 are coupled to a VDD power rail and the emitters of transistors T7 and T8 are coupled to a VSS power rail through resistors R7 and R8 respectively. The emitter of transistor T7 is coupled to the base of transistor T8 and the base of transistor T7 is open. Transistor T7 may be selected from any of the SiGe bipolar transistors illustrated in FIGS. 2A and 2B, 3A and 3B, 4A and 4B, 5A and 5B, and 6A and 6B and the bipolar junction transistors illustrated in FIGS. 7A and 7B, 8A and 8B, 9A and 9B, 10A and 10B, and 11A and 11B and described supra. The crooked arrow pointing from the collector to the emitter of transistor T7 indicates transistor T7 has a masked subcollector and that the BVceo of transistor T7 has been tuned by at least by fixing the masked subcollector pull back as described supra. Transistor T7 may also be further tuned by control of the depth and doping level of the masked subcollector and/or by additional ion implantations between the base and masked subcollector. It should be apparent that the BVceo tuning is fixed during fabrication of transistor T7. The fact that transistor T7 is a BVceo tunable bipolar transistor and has a higher BVceo than would otherwise be obtained, imparts to circuit 320 a higher trigger voltage than would otherwise be obtained using standard bipolar transistors. Further, the inclusion of varactor V1 adds additional trigger range outside of the range of transistor T7. For example, if varactor V1 includes 1, 2 or 3 Schotky diodes, the trigger voltage of circuit 315 will be 0.9, 1.2 or 1.5 volts respectively plus the BVceo of transistor T7. In a first example the BVceo of transistor T7 is greater than the BVceo of transistor T8. In a second example the BVceo of transistor T7 is less than the BVceo of transistor T8.

Figure 17:
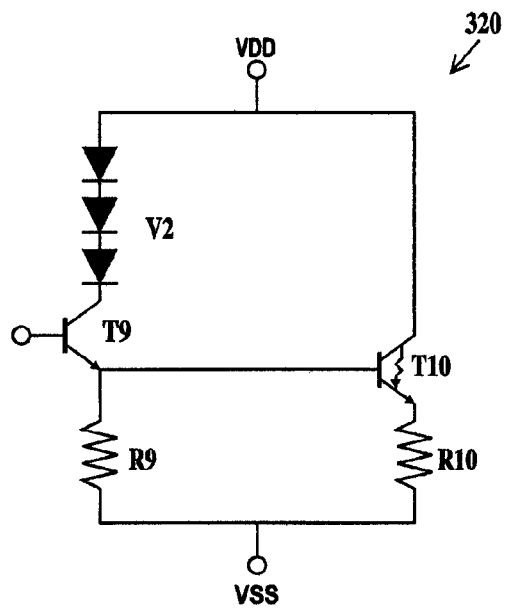
FIG. 17 is an ESD trigger and power clamp circuit according to a fifth embodiment of the present invention.

FIG. 17 is an ESD trigger and power clamp circuit according to a fifth embodiment of the present invention. In FIG. 17, circuit 320 includes transistors T9 and T10, resistors R9 and R10 and a varactor V2 comprised of one or more diode elements which may include but is not limited to SiGe base Schotky diodes, complimentary metal-oxide silicon (CMOS) diodes, a SiGe bipolar transistor configured as a diode or a bipolar junction diode configured as a diode. The collectors of transistor T9 and T10 are coupled to a VDD power rail and the emitters of transistors T9 and T10 are coupled to a VSS power rail through resistors R9 and R10 respectively. The emitter of transistor T9 is coupled to the base of transistor T10 and the base of transistor T9 is open. Transistor T10 may be selected from any of the SiGe bipolar transistors illustrated in FIGS. 2A and 2B, 3A and 3B, 4A and 4B, 5A and 5B, and 6A and 6B and the bipolar junction transistors illustrated in FIGS. 7A and 7B, 8A and 8B, 9A and 9B, 10A and 10B, and 11A and 11B and described supra. The crooked arrow pointing from the collector to the emitter of transistor T10 indicates transistor T10 has a masked subcollector and that the BVceo of transistor T10 has been tuned by at least by fixing the masked subcollector pull back as described supra. Transistor T10 may also be further tuned by control of the depth and doping level of the masked subcollector and/or by additional ion implantations between the base and masked subcollector. It should be apparent that the BVceo tuning is fixed during fabrication of transistor T10. The fact that transistor T10 is a BVceo tunable bipolar transistor and has a higher BVceo than would otherwise be obtained, imparts to circuit 320 a higher trigger voltage than would otherwise be obtained using standard bipolar transistors. Further, the inclusion of varactor V2 adds additional trigger range outside of the range of transistor T10. For example, if varactor V2 includes 1, 2 or 3 Schotky diodes, the trigger voltage of circuit 320 will be 0.9, 1.2 or 1.5 volts respectively plus the BVceo of transistor T10. In a first example the BVceo of transistor T9 is greater than the BVceo of transistor T10. In a second example the BVceo of transistor T9 is less than the BVceo of transistor T10.

Figure 18:
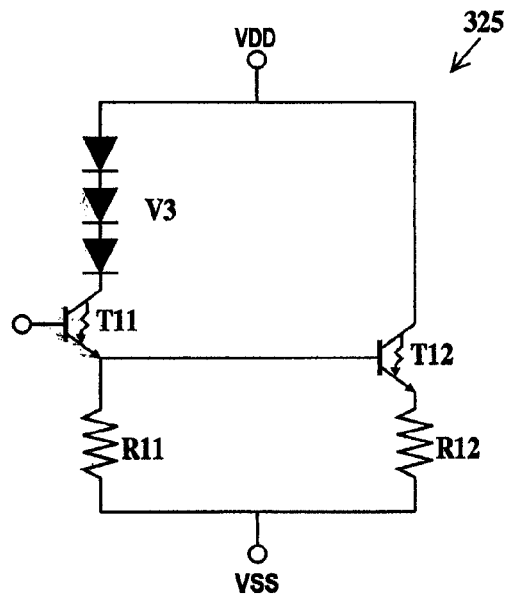
FIG. 18 is an ESD trigger and power clamp circuit according to a sixth embodiment of the present invention.

FIG. 18 is an ESD trigger and power clamp circuit according to a sixth embodiment of the present invention. In FIG. 18, circuit 325 includes transistors T11 and T12, resistors R11 and R12 and a varactor V3 comprised of one or more diode elements which may include but is not limited to SiGe base Schotky diodes, complimentary metal-oxide silicon (CMOS) diodes, a SiGe bipolar transistor configured as a diode or a bipolar junction diode configured as a diode. The collectors of transistor T11 and T12 are coupled to a VDD power rail and the emitters of transistors T11 and T12 are coupled to a VSS power rail through resistors R11 and R12 respectively. The emitter of transistor T11 is coupled to the base of transistor T12 and the base of transistor T11 is open. Transistors T11 and T12 may be independently selected from any of the SiGe bipolar transistors illustrated in FIGS. 2A and 2B, 3A and 3B, 4A and 4B, 5A and 5B, and 6A and 6B and the bipolar junction transistors illustrated in FIGS. 7A and 7B, 8A and 8B, 9A and 9B, 10A and 10B, and 11A and 11B and described supra. The crooked arrow pointing from the collectors to the emitters of transistors T11 and T12 indicates transistors T11 and T12 have masked subcollectors and that the BVceo"s of transistors T11 and T12 have been tuned by at least by fixing the masked subcollector pull back as described supra. Transistors T11 and T12 may also be further tuned by control of the depth and doping level of their respective masked subcollectors and/or by additional ion implantations between their respective bases and masked subcollectors. It should be apparent that the BVceo tuning is fixed during fabrication of transistors T11 and T12. The fact that transistors T11 and T12 are BVceo tunable bipolar transistors and have higher BVceo"s than would otherwise be obtained, imparts to circuit 325 a higher trigger voltage and a higher clamping voltage than would otherwise be obtained using standard bipolar transistors. Further, the inclusion of varactor V3 adds additional trigger range outside of the range of transistor T11. For example, if varactor V3 includes 1, 2 or 3 Schotky diodes, the trigger voltage of circuit 325 will be 0.9, 1.2 or 1.5 volts respectively plus the BVceo of transistor T11. In one example the BVceo of transistor T11 is less than the BVceo of transistor T12.

Figure 19:
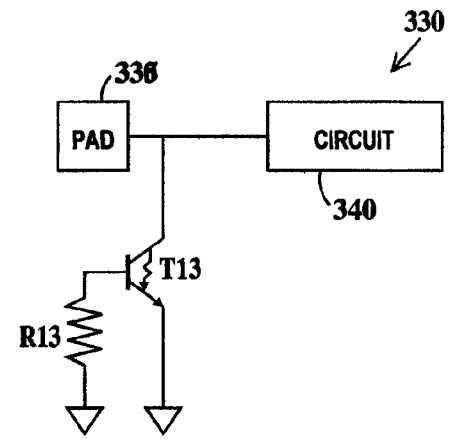
FIG. 19 is an ESD protection circuit according to a seventh embodiment of the present invention.

FIG. 19 is an ESD protection circuit according to a seventh embodiment of the present invention. In FIG. 330 ESD protection circuit includes a pad 335, a circuit 340, a transistor T13 and a resistor R13. Pad 335 is coupled to circuit 340 and the collector of transistor T13. The base of transistor T13 is coupled to ground though optional resistor R13 and the emitter of transistor T13 is coupled to ground. The crooked arrow pointing from the collector to the emitter of transistors T13 indicates transistor T13 has a masked subcollectors and that the BVceo"s of transistor T13 have been tuned by at least by fixing the masked subcollector pull back as described supra. Transistor T13 may also be further tuned by control of the depth and doping level of their respective masked subcollectors and/or by additional ion implantations between their respective bases and masked subcollectors. It should be apparent that the BVceo tuning is fixed during fabrication of transistor T13.

Traditionally, ESD designs are custom designed using graphical systems. ESD ground-rules and structures are typically built into the designs requiring a mandatory custom layout. An ESD CAD system has been developed to fulfill the objective of design flexibility, RF characterization and models of ESD elements, automation, and choice of ESD network type. This system is fully described in a paper "A Design System for Auto-generation of ESD Circuits," presented at the "International Cadence Usergroup Conference, held Sep. 16–18, 2002 in San Jose Calif. and is hereby incorporated by reference. The present invention describes a method of designing ESD circuits utilizing tunable SiGe bipolar and tunable bipolar junction transistors as described supra using this auto ESD circuit generation system with some modification.

The design system is a hierarchical system of parameterized cells, which are constructed into higher-level ESD networks. Lowest order p-cells are RF and dc characterized. ESD verification, dc characterization, schematics and LVS are completed on the higher order circuits. Diode, bipolar and MOSFET hierarchical cells are used to establish both CMOS MOSFET-based ESD networks and SiGe bipolar-based networks. The parameterized cells, known as P-cells, are constructed in a CADENCE™ design system. The p-cells are grow-able elements, which fix some variables, and pass some variables to the higher order circuit through "inheritance". From base p-cells, ESD circuits are constructed for input pads, $V_{DD}$-to-$V_{SS}$ power clamps, and $V_{SS}$-to-$V_{SS}$ power clamps. In these categories, there exists both the CMOS-based and the BiCMOS SiGe-based implementations.

The ESD design system allows for change of circuit topology as well as structure size in an automated fashion. Layout and circuit schematics are auto-generated with the user varying the number of elements in the circuit. The circuit topology automation allows for the user to autogenerate new ESD circuits and ESD power clamps without additional design work. Interconnects and wiring between the circuit elements are also auto-generated.

Figure 20:
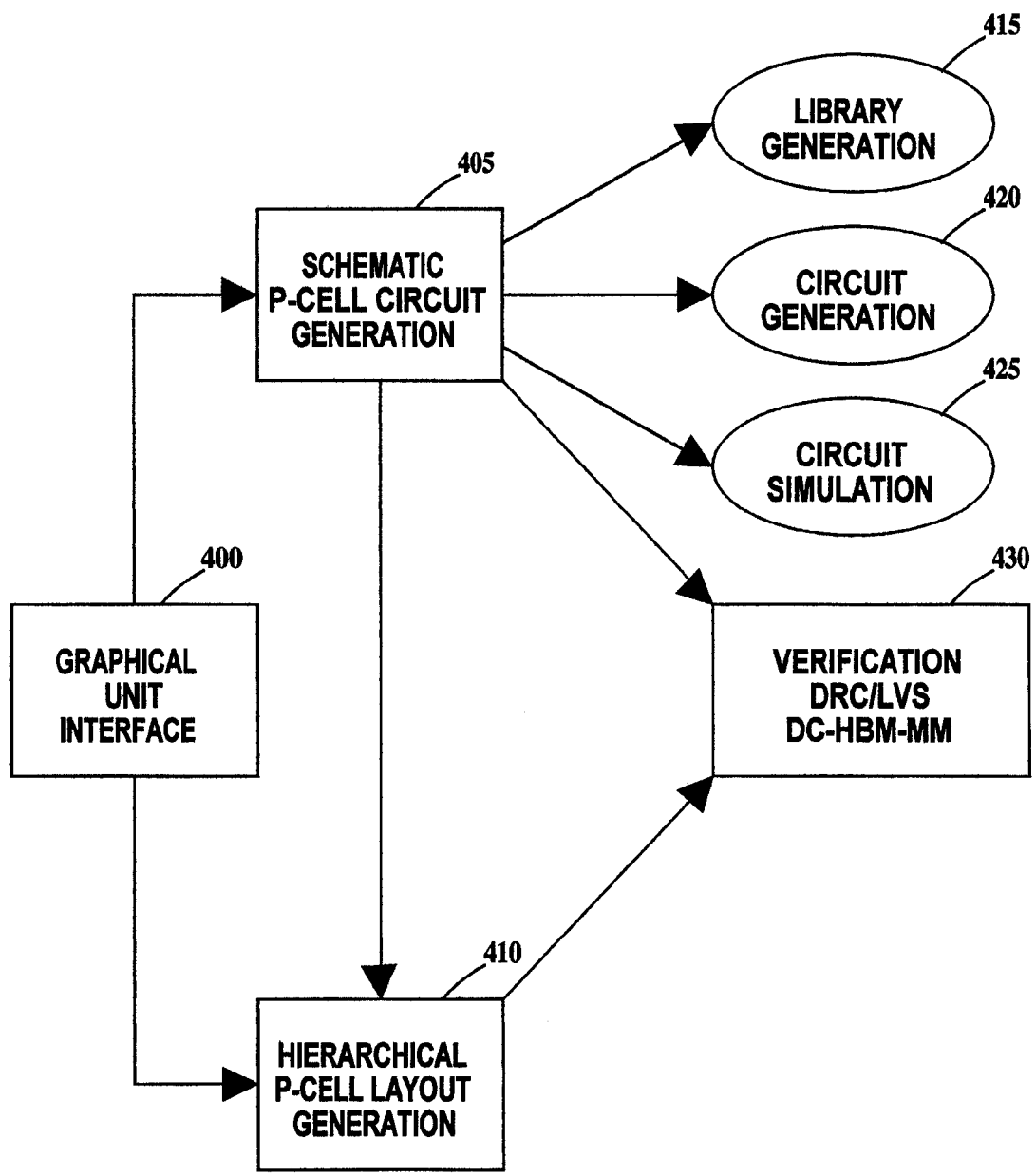
FIG. 20 is a process flow diagram for an exemplary system for designing ESD trigger and power clamp circuits according to the present invention.

FIG. 20 is a process flow diagram for an exemplary system for designing ESD trigger and power clamp circuits according to the present invention. To achieve auto-generation of ESD circuits the design flow illustrated in FIG. 20 is utilized. A graphical interface 400 allows input to both a schematic P-cell circuit generation module 405 and a hierarchical P-cell layout generation module 410. Schematic P-cell circuit generation module 405 supplies P-cells to a library generation module 415, a circuit generation module 420 and a circuit simulation module 425. Both schematic P-cell circuit generation module 405 and hierarchical P-cell layout generation module 410 supply input into a verification module 430.

The flow illustrated in FIG. 20 is based on the development of P-cells for both the schematic and layout cells. The P-cells are hierarchical and built from device primitives, which have been RF characterized and models. Without the need for additional RF characterization, the design kit development cycle is compressed.

Figure 21:
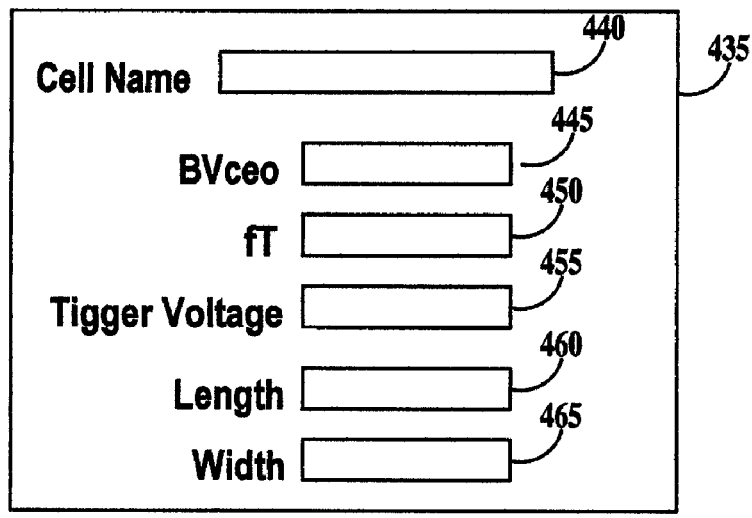
FIG. 21 is an exemplary illustration of a graphical unit interface (GUI) screen of the ESD circuit design system illustrated in FIG. 18.

FIG. 21 is an exemplary illustration of a GUI screen of the ESD circuit design system illustrated in FIG. 20. In FIG. 21, GUI 435 includes a cell name input field 440, a BVceo desired value input field 445, a fT display field 450, a desired trigger voltage input field 455, a transistor length input field 460 and a transistor width input field. After a user fills in all input fields, tunable BVceo transistors that will meet the inputted criteria are selected from lookup tables of length, width, BVceo and fT and an ESD Trigger/Clamp circuit designed using those elements. The fT is displayed, so the user can make changes if the value of fT is too low.

Figure 22:
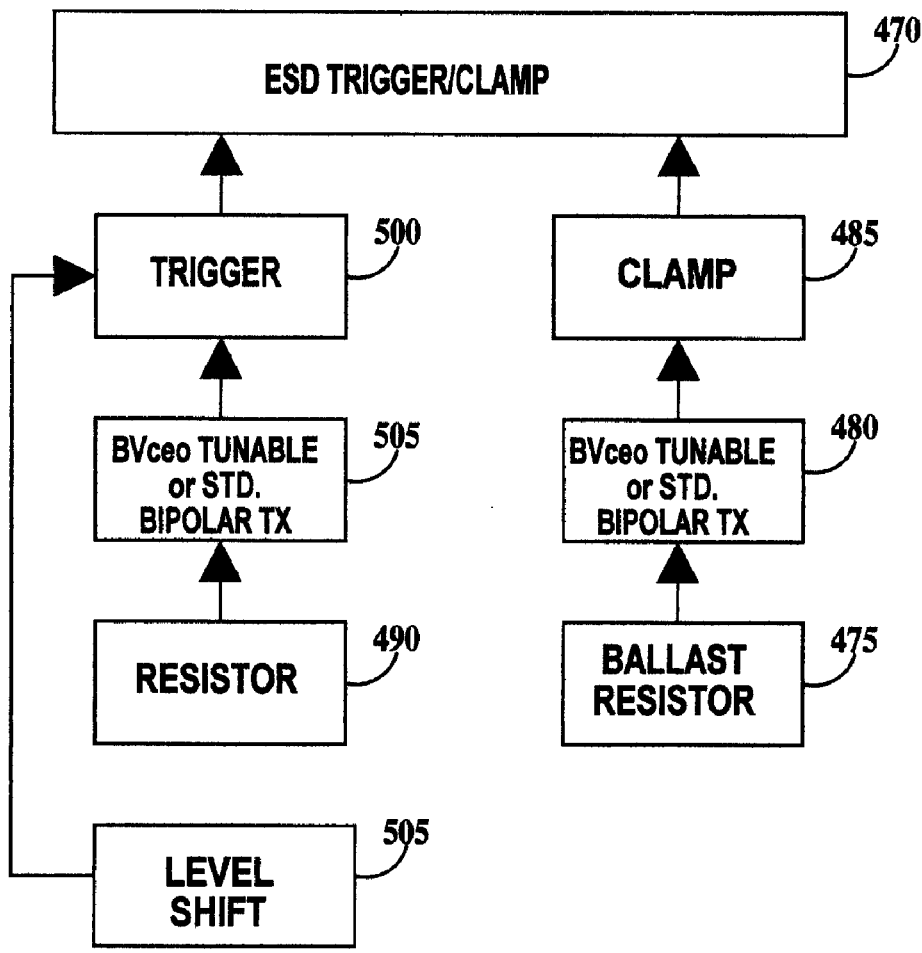
FIG. 22 is an exemplary ESD trigger and power clamp circuit hierarchal structure generated by the ESD circuit design system of FIG. 18.

FIG. 22 is an exemplary ESD trigger and power clamp circuit hierarchal structure generated by the ESD circuit design system of FIG. 20. In FIG. 22, the structure for ESD circuits of the type illustrated in FIGS. 13, 14, 15, 16, 17, 18 and 19 and described supra is illustrated. In FIG. 22, a hierarchical P-cell 470 of the ESD power clamp circuit is generated allowing for different sizes. In hierarchical ESD trigger/clamp circuit P-cell 470, the design includes a ballast resistor P-cell 475 and a BVceo tunable transistor P-cell 480 (or a standard transistor) that make up a clamp P-cell 485 and a bias resistor P-cell 490 and a BVceo tunable transistor P-cell 505 (or a standard transistor) that that make up a trigger P-cell 500. The ESD trigger/clamp circuits of FIGS. 13, 14, 15, 16, 17 and 18 would utilize the P-cells so far described. To address the different power supply conditions trigger P-cell 500 may include a level-shifting parameterized sub-design P-cell 505. The ESD trigger/clamp circuits of FIGS. 16, 17 and 18 would utilize is option.

Thus the present invention provides an ESD trigger and power clamp circuit compatible with high performance bipolar technology by providing ESD trigger and power clamp circuits incorporating high performance bipolar devices with tunable BVceo and fT.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while NPN bipolar transistors have been illustrated and described one of ordinary skill in the art would understand that the present invention is applicable to PNP bipolar transistors as well. Therefore, it is intended that the following claims cover all such modifications and changes as fall within the true spirit and scope of the invention.

What is claimed is:

1. An electrostatic discharge protection circuit, comprising:
   a first bipolar transistor coupled between a first circuit node and a second circuit node, said first bipolar transistor having a non-uniform subcollector region geometry, said first bipolar transistor having a different value for collector to emitter breakdown voltage than a value for collector to emitter breakdown voltage of an otherwise identical bipolar transistor having a uniform subcollector region geometry.

2. The circuit of claim 1, wherein said different value for collector to emitter breakdown voltage than a value for collector to emitter breakdown voltage of an otherwise identical bipolar transistor having a uniform subcollector region geometry is a higher value.

3. The circuit of claim 1, wherein said first bipolar transistor has a different value for unity current gain cutoff frequency than a value for unity current gain cutoff frequency of said otherwise identical bipolar transistor.

4. The circuit of claim 3, wherein said different value for unity current gain cutoff frequency than a value for unity current gain cutoff frequency of said otherwise identical bipolar transistor is a lower value.

5. The circuit of claim 1, wherein said non-uniform subcollector region geometry of said first bipolar transistor is selected from the group of geometries consisting of ring geometries having an opening aligned under said emitter of said first bipolar transistor, dual striped geometries having a first stripe located on a first side and a second stripe located on an opposite second side of and away from a plane longitudinally bisecting said emitter of said first bipolar transistor and single striped geometries having a stripe located on one side of and away from a plane longitudinally bisecting said emitter of said first bipolar transistor.

6. The circuit of claim 1, wherein said first circuit node is a signal pad and said circuit node is a power rail.

7. The circuit of claim 1, wherein said first bipolar transistor is selected from the group of transistors consisting of hetero-junction bipolar transistors, SiGe hetero-junction bipolar transistors, SiGeC hetero-junction bipolar transistors, bipolar homo-junction transistors and bipolar junction transistors.

8. The circuit of claim 1, wherein said first bipolar transistor comprises a bulk silicon bipolar transistor or a silicon-on-insulator bipolar transistor.

9. The circuit of claim 1, further including
a second bipolar transistor;
a collector of said first bipolar transistor and a collector of said second bipolar transistor coupled to said first circuit node, said first circuit node being a first power rail;
said emitter of said first bipolar transistor and an emitter of said second bipolar transistor coupled to said second circuit node, said second circuit node being a second power rail; and
said emitter of said first bipolar transistor coupled to a base of said second bipolar transistor.

10. The circuit of claim 9, wherein said first bipolar transistor has a higher collector to emitter breakdown voltage than said a collector to emitter breakdown of said second bipolar transistor or said first bipolar transistor has a lower collector to emitter breakdown voltage than said collector to emitter breakdown of said second bipolar transistor.

11. The circuit of claim 9, wherein second bipolar has a non-uniform subcollector region geometry, said second bipolar transistor having a different value for collector to emitter breakdown voltage than a value for collector to emitter breakdown voltage of said otherwise identical bipolar transistor.

12. The circuit of claim 11, wherein said first bipolar transistor has a lower collector to emitter breakdown voltage than said collector to emitter breakdown of said second bipolar transistor.

13. The circuit of claim 1, further including
a second bipolar transistor;
a collector of said second bipolar transistor and a collector of said first bipolar transistor coupled to said first circuit node, said first circuit node being a first power rail;
said emitter of said second bipolar transistor and an emitter of said first bipolar transistor coupled to said second circuit node, said second circuit node being a second power rail; and
said emitter of said second bipolar transistor coupled to a base of said first bipolar transistor.

14. The circuit of claim 13, wherein said first bipolar transistor has a higher collector to emitter breakdown voltage than said a collector to emitter breakdown of said second bipolar transistor or said first bipolar transistor has a lower collector to emitter breakdown voltage than said collector to emitter breakdown of said second bipolar transistor.

15. The circuit of claim 9, further including either (a) a resistor coupled between said emitter of said first bipolar transistor and said second power rail, (b) a resistor coupled between said emitter of said second bipolar transistor and said second power rail, or (c) a first resistor coupled between said emitter of said first bipolar transistor and said second power rail and a second resistor coupled between said emitter of said second bipolar transistor and said second power rail.

16. The circuit of claim 11, further including either (a) a resistor coupled between said emitter of said first bipolar transistor and said second power rail, (b) a resistor coupled between said emitter of said second bipolar transistor and said second power rail, or (c) a first resistor coupled between said emitter of said first bipolar transistor and said second power rail and a second resistor coupled between said emitter of said second bipolar transistor and said second power rail.

17. The circuit of claim 13, further including either (a) a resistor coupled between said emitter of said first bipolar transistor and said second power rail, (b) a resistor coupled between said emitter of said second bipolar transistor and said second power rail, or (c) a first resistor coupled between said emitter of said first bipolar transistor and said second power rail and a second resistor coupled between said emitter of said second bipolar transistor and said second power rail.

18. The circuit of claim 9, further including a varactor network coupled between said collector of said first bipolar transistor and said first power rail.

19. The circuit of claim 11, further including a varactor network coupled between said collector of said first bipolar transistor and said first power rail.

20. The circuit of claim 13, further including a varactor network coupled between said collector of said second bipolar transistor and said first power rail.

21. A method of providing an electrostatic discharge protection to an integrated circuit, comprising:
providing a first bipolar transistor;
coupling said first bipolar transistor between a first circuit node and a second circuit node, said first bipolar transistor having a non-uniform subcollector region geometry; and
selecting said non-uniform subcollector region geometry in order to tune a collector to emitter breakdown voltage of said first bipolar transistor.

22. The method of claim 21, further including selecting said non-uniform subcollector region geometry in order to tune a unity current gain cutoff frequency of said first bipolar transistor.

23. The method of claim 21, wherein said non-uniform subcollector region geometry of said first bipolar transistor is selected from the group of geometries consisting of ring geometries having an opening aligned under said emitter of said first bipolar transistor, dual striped geometries having a first stripe located on a first side and a second stripe located on an opposite second side of and away from a plane longitudinally bisecting said emitter of said first bipolar transistor and single striped geometries having a stripe located on one side of and away from a plane longitudinally bisecting said emitter of said first bipolar transistor.

24. The method of claim 21, wherein said first bipolar transistor is selected from the group of transistors consisting of hetero-junction bipolar transistors, SiGe hetero-junction bipolar transistors, SiGeC hetero-junction bipolar transistors, bipolar homo-junction transistors and bipolar junction transistors.

25. The method of claim 21, wherein said first bipolar transistor comprises a bulk silicon bipolar transistor or a silicon-on-insulator bipolar transistor.

26. The method of claim 21, wherein said first circuit node is a signal pad and said circuit node is a power rail.

27. The method of claim 21, further including providing a collector of said first bipolar transistor and a collector of said second bipolar transistor coupled to said first circuit node, said first circuit node being a first power rail;
  said emitter of said first bipolar transistor and an emitter of said second bipolar transistor coupled to said second circuit node, said second circuit node being a second power rail; and
  said emitter of said first bipolar transistor coupled to a base of said second bipolar transistor.

28. The method of claim 27, wherein said first bipolar transistor has a higher collector to emitter breakdown voltage than said a collector to emitter breakdown of said second bipolar transistor or said first bipolar transistor has a lower collector to emitter breakdown voltage than said collector to emitter breakdown of said second bipolar transistor.

29. The method of claim 27, wherein second bipolar has a non-uniform subcollector region geometry, said second bipolar transistor having a different value for collector to emitter breakdown voltage than a value for collector to emitter breakdown voltage of said otherwise identical bipolar transistor.

30. The method of claim 29, wherein said first bipolar transistor has a lower collector to emitter breakdown voltage than said collector to emitter breakdown of said second bipolar transistor.

31. The circuit of claim 21, further including providing a second bipolar transistor;
  providing a collector of said second bipolar transistor and a collector of said first bipolar transistor coupled to said first circuit node, said first circuit node being a first power rail;
  said emitter of said second bipolar transistor and an emitter of said first bipolar transistor coupled to said second circuit node, said second circuit node being a second power rail; and
  said emitter of said second bipolar transistor coupled to a base of said first bipolar transistor.

32. The method of claim 21, wherein said first bipolar transistor has a higher collector to emitter breakdown voltage than said a collector to emitter breakdown of said second bipolar transistor or said first bipolar transistor has a lower collector to emitter breakdown voltage than said collector to emitter breakdown of said second bipolar transistor.

33. The method of claim 27, further including either (a) a resistor coupled between said emitter of said first bipolar transistor and said second power rail, (b) a resistor coupled between said emitter of said second bipolar transistor and said second power rail, or (c) a first resistor coupled between said emitter of said first bipolar transistor and said second power rail and a second resistor coupled between said emitter of said second bipolar transistor and said second power rail.

34. The method of claim 29, further including either (a) a resistor coupled between said emitter of said first bipolar transistor and said second power rail, (b) a resistor coupled between said emitter of said second bipolar transistor and said second power rail, or (c) a first resistor coupled between said emitter of said first bipolar transistor and said second power rail and a second resistor coupled between said emitter of said second bipolar transistor and said second power rail.

35. The method of claim 31, further including either (a) a resistor coupled between said emitter of said first bipolar transistor and said second power rail, (b) a resistor coupled between said emitter of said second bipolar transistor and said second power rail, or (c) a first resistor coupled between said emitter of said first bipolar transistor and said second power rail and a second resistor coupled between said emitter of said second bipolar transistor and said second power rail.

36. The method of claim 27, further including a varactor network coupled between said collector of said first bipolar transistor and said first power rail.

37. The method of claim 29, further including a varactor network coupled between said collector of said first bipolar transistor and said first power rail.

38. The method of claim 31, further including a varactor network coupled between said collector of said second bipolar transistor and said first power rail.

39. A method of designing an electrostatic discharge protection circuit, comprising:
  providing a schematic P-cell circuit generator;
  providing a hierarchical P-cell layout generator;
  providing a graphical unit interface to said schematic P-cell circuit generator and said hierarchical P-cell layout generator;
  accepting a value for a collector to emitter breakdown voltage target for at least a first bipolar transistor of said electrostatic discharge protection circuit;
  selecting a non-uniform subcollector region geometry for said first bipolar transistor based on said value of said collector to emitter breakdown voltage target; and
  generating a circuit design and a layout for said electrostatic discharge protection circuit, said electrostatic discharge protection circuit containing said first bipolar transistor.

40. The method of claim 39, further including displaying a value for a unity current gain cutoff frequency of said first bipolar transistor.

* * * * *